US010037798B2

(12) United States Patent
Onuki

(10) Patent No.: US 10,037,798 B2
(45) Date of Patent: Jul. 31, 2018

(54) SEMICONDUCTOR DEVICE AND METHOD FOR DRIVING SEMICONDUCTOR DEVICE

(71) Applicant: Semiconductor Energy Laboratory Co., Ltd., Atsugi-shi, Kanagawa-ken (JP)

(72) Inventor: Tatsuya Onuki, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/603,570

(22) Filed: May 24, 2017

(65) Prior Publication Data

US 2017/0256307 A1    Sep. 7, 2017

Related U.S. Application Data

(62) Division of application No. 14/218,058, filed on Mar. 18, 2014, now Pat. No. 9,666,271.

(30) Foreign Application Priority Data

Mar. 22, 2013   (JP) .................................. 2013-060687

(51) Int. Cl.
*G11C 5/06*     (2006.01)
*G11C 11/56*    (2006.01)
(Continued)

(52) U.S. Cl.
CPC .......... *G11C 11/565* (2013.01); *G11C 11/403* (2013.01); *G11C 11/4076* (2013.01); *G11C 11/4091* (2013.01)

(58) Field of Classification Search
CPC .. G11C 11/565; G11C 11/403; G11C 11/4076
(Continued)

(56) References Cited

U.S. PATENT DOCUMENTS 4,466,081 A    8/1984   Masuoka
5,731,856 A    3/1998   Kim et al.
(Continued)

FOREIGN PATENT DOCUMENTS

CN    102725961 A    10/2012
EP      1737044 A    12/2006
(Continued)

OTHER PUBLICATIONS

Chinese Office Action (Application No. 201480017155.4) dated Jun. 23, 2017.
(Continued)

*Primary Examiner* — Anthan Tran
(74) *Attorney, Agent, or Firm* — Fish & Richardson P.C.

(57) ABSTRACT

To provide a semiconductor device which can write and read a desired potential. The semiconductor device includes a first transistor (Tr), a second Tr, and a capacitor. In the semiconductor device, operation of writing data is performed by a first step and a second step. In the first step, a low voltage is applied to a bit line and a first wiring to turn on the first Tr and the second Tr. In the second step, a first voltage is applied to the first wiring, and application of the low voltage to the bit line is stopped. Operation of reading the data is performed by a third step and a fourth step. In the third step, a high voltage is applied to the first wiring. In the fourth step, application of the high voltage to the first wiring is stopped, and a low voltage is applied to a capacitor line.

14 Claims, 30 Drawing Sheets

(51) Int. Cl.
*G11C 11/403* (2006.01)
*G11C 11/4091* (2006.01)
*G11C 11/4076* (2006.01)

(58) Field of Classification Search
USPC .......................................................... 365/63
See application file for complete search history.

(56) References Cited

U.S. PATENT DOCUMENTS

| | | | |
|---|---|---|---|
| 5,744,864 | A | 4/1998 | Cillessen et al. |
| 6,127,702 | A | 10/2000 | Yamazaki et al. |
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 6,856,534 | B2 | 2/2005 | Rodriguez et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al. |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,674,650 | B2 | 3/2010 | Akimoto et al. |
| 7,732,819 | B2 | 6/2010 | Akimoto et al. |
| 8,183,890 | B1 | 5/2012 | Oo |
| 8,542,528 | B2 | 9/2013 | Sekine et al. |
| 8,638,128 | B1 | 1/2014 | Oo |
| 8,659,957 | B2 | 2/2014 | Sekine |
| 9,123,432 | B2 | 9/2015 | Sekine et al. |
| 9,159,738 | B2 | 10/2015 | Yamauchi |
| 9,171,630 | B2 | 10/2015 | Nagatsuka et al. |
| 9,214,469 | B2 | 12/2015 | Yamauchi |
| 9,240,244 | B2 | 1/2016 | Nagatsuka et al. |
| 9,443,844 | B2 | 9/2016 | Takemura |
| 9,472,293 | B2 | 10/2016 | Nagatsuka et al. |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager, III et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0047266 | A1 | 3/2005 | Shionoiri et al. |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0280600 | A1 | 11/2009 | Hosono et al. |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |
| 2010/0148171 | A1 | 6/2010 | Hayashi et al. |
| 2011/0176652 | A1 | 7/2011 | Kurokawa |
| 2012/0033488 | A1 | 2/2012 | Nagatsuka et al. |
| 2012/0033505 | A1* | 2/2012 | Sekine ................. G11C 11/405 365/189.05 |
| 2012/0063203 | A1 | 3/2012 | Matsuzaki et al. |
| 2012/0230114 | A1* | 9/2012 | Sekine ................. G11C 11/5628 365/185.22 |
| 2012/0257439 | A1 | 10/2012 | Kurokawa |
| 2012/0287700 | A1* | 11/2012 | Takemura ............. G11C 11/405 365/149 |
| 2014/0269099 | A1* | 9/2014 | Nagatsuka ......... G11C 16/0441 365/185.23 |
| 2015/0003165 | A1 | 1/2015 | Yamauchi |
| 2015/0043279 | A1 | 2/2015 | Yamauchi |
| 2015/0263725 | A1 | 9/2015 | Onuki |
| 2015/0280001 | A1 | 10/2015 | Matsuzaki et al. |

FOREIGN PATENT DOCUMENTS

| | | | |
|---|---|---|---|
| EP | 2226847 | A | 9/2010 |
| JP | 57-105889 | A | 7/1982 |
| JP | 59-152725 | A | 8/1984 |
| JP | 60-198861 | A | 10/1985 |
| JP | 63-210022 | A | 8/1988 |
| JP | 63-210023 | A | 8/1988 |
| JP | 63-210024 | A | 8/1988 |
| JP | 63-215519 | A | 9/1988 |
| JP | 63-239117 | A | 10/1988 |
| JP | 63-265818 | A | 11/1988 |
| JP | 04-255988 | A | 9/1992 |
| JP | 05-128861 | A | 5/1993 |
| JP | 05-251705 | A | 9/1993 |
| JP | 07-065594 | A | 3/1995 |
| JP | 08-264794 | A | 10/1996 |

(56) References Cited

FOREIGN PATENT DOCUMENTS

| | | |
|---|---|---|
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2005-063548 A | 3/2005 |
| JP | 2012-198977 A | 10/2012 |
| JP | 2012-252766 A | 12/2012 |
| JP | 2012-252770 A | 12/2012 |
| JP | 2012-256398 A | 12/2012 |
| JP | 2012-256400 A | 12/2012 |
| JP | 2012-256406 A | 12/2012 |
| JP | 2014-199707 A | 10/2014 |
| JP | 2014-199708 A | 10/2014 |
| JP | 2015-187903 A | 10/2015 |
| JP | 2015-201245 A | 11/2015 |
| TW | 201248629 | 12/2012 |
| WO | WO-2004/114391 | 12/2004 |
| WO | WO-2011/086829 | 7/2011 |
| WO | WO-2013/105460 | 7/2013 |
| WO | WO-2013/153853 | 10/2013 |
| WO | WO-2014/142043 | 9/2014 |
| WO | WO-2014/142332 | 9/2014 |

OTHER PUBLICATIONS

Ishii.T et al., "A Poly-Silicon TFT With a Sub-5-nm Thick Channel for Low-Power Gain Cell Memory in Mobile Applications", IEEE Transactions on Electron Devices, Nov. 1, 2004, vol. 51, No. 11, pp. 1805-1810.

Kim.W et al., "An Experimental High-Density DRAM Cell with a Built-in Gain Stage", IEEE Journal of Solid-State Circuits, Aug. 1, 1994, vol. 29, No. 8, pp. 978-981.

Shukuri.S et al., "A Complementary Gain Cell Technology for sub-1 V Supply DRAMs", IEDM 92: Technical Digest of International Electron Devices Meeting, Dec. 13, 1992, pp. 1006-1008.

Shukuri.S et al., "A Semi-Static Complementary Gain Cell Technology for Sub-1 V Supply DRAM's", IEEE Transactions on Electron Devices, Jun. 1, 1994, vol. 41, No. 6, pp. 926-931.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Asaoka.Y et al., "29.1:Polarizer-Free Reflective LCD Combined With Ultra Low-Power Driving Technology", SID Digest '09: SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09: SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced At Room Temperature", Appl. Phys. Lett. (Applied Physics Letters), Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09: SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08: SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07: SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08: SID International Symposium Digest of Technical Papers, May 20, 2008, vol. 39, pp. 1277-1280.

Ikeda.T et al., "Full-Functional System Liquid Crystal Display Using Cg-Silicon Technology", SID Digest '04: SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters), 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08: SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09: SID International Symposium Digest of Technical Papers, May 31, 2009, pp. 983-985.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09: SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07: SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YbFe2O4, and Yb2Fe3O7 Types of Structures for Compounds in the In2O3 and Sc2O—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

(56) References Cited

OTHER PUBLICATIONS

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits, 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED ", IDW '06: Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08: SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09: SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07: SID International Symposium Digest of Technical Papers, 2007, vol. 38, pp. 1673-1676.

Mo.Y et al., "Amorphous Oxide TFT Backplanes for Large Size AMOLED Displays", IDW '08: Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09: SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn-Oxide TFTs With a Novel Passivation Layer", SID Digest '09: SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09: SID International Symposium Digest of Technical Papers, May 31, 2009, vol. 40, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by PEALD Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08: SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Sakata.J et al., "Development of 4.0-In. AMOLED Display With Driver Circuit Using Amorphous In—Ga—Zn Oxide TFTs", IDW '09: Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08: SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08: Proceedings of the 15th International Display Workshops, Dec. 3, 2008, pp. 1637-1640.

Tsuda.K et al., "Ultra Low Power Consumption Technologies for Mobile TFT-LCDs", IDW '02: Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

(56) References Cited

OTHER PUBLICATIONS

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
International Search Report (Application No. PCT/JP2014/057947) dated Jun. 3, 2014.
Written Opinion (Application No. PCT/JP2014/057947) dated Jun. 3, 2014.
Taiwanese Office Action (Application No. 103110481) dated Feb. 13, 2018.

* cited by examiner

600

SEMICONDUCTOR DEVICE AND METHOD FOR DRIVING SEMICONDUCTOR DEVICE

CROSS-REFERENCE TO RELATED APPLICATIONS

This application is a divisional of U.S. application Ser. No. 14/218,058, filed Mar. 18, 2014, now allowed, which claims the benefit of a foreign priority application filed in Japan as Serial No. 2013-060687 on Mar. 22, 2013, both of which are incorporated by reference.

TECHNICAL FIELD

The present invention relates to an object, a method, or a manufacturing method. In particular, the present invention relates to, for example, a semiconductor device, a display device, a light-emitting device, a power storage device, a driving method thereof, or a manufacturing method thereof. The present invention particularly relates to a semiconductor device, a display device, or a light-emitting device each including an oxide semiconductor, for example.

BACKGROUND ART

Patent Document 1 describes a semiconductor device which includes a transistor using an oxide semiconductor film and a transistor using single crystal silicon. Patent Document 1 also describes a transistor using an oxide semiconductor film has extremely low off-state leakage current.

Patent Document

[Patent Document 1] Japanese Published Patent Application No. 2012-256400

DISCLOSURE OF INVENTION

One embodiment of the present invention provides a semiconductor device capable of writing a predetermined potential and reading the potential. One embodiment of the present invention provides a semiconductor device which does not need a verify operation. One embodiment of the present invention provides a semiconductor device which shows high retention characteristics in storing multi-bit data and high reliability.

It is an object of one embodiment of the present invention to provide a semiconductor device or the like with low off-state current. Another object of one embodiment of the present invention is to provide a semiconductor device or the like with low power consumption. Another object of one embodiment of the present invention is to provide a semiconductor device or the like using a transparent semiconductor layer. Another object of one embodiment of the present invention is to provide a semiconductor device or the like using a semiconductor layer with high reliability.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is a semiconductor device which includes a first transistor, a second transistor, and a capacitor. A region in which a channel of the first transistor is formed comprises an oxide semiconductor film. A gate of the first transistor is electrically connected to a word line. One of a source and a drain of the first transistor is electrically connected to a bit line. The other of the source and the drain of the first transistor is electrically connected to one electrode of the capacitor and a gate of the second transistor. The other electrode of the capacitor is electrically connected to a capacitor line. One of a source and a drain of the second transistor is electrically connected to a first wiring. The other of the source and the drain of the second transistor is electrically connected to the bit line. Operation of writing data comprises a first step and a second step. In the first step, a low voltage is applied to the bit line and the first wiring, a high voltage is applied to the word line to turn on the first transistor, and a low voltage is applied to the capacitor line, thereby turning on the second transistor. In the second step, a first voltage is applied to the first wiring, and application of the low voltage to the bit line is stopped. To store the data, a low voltage is applied to the word line to turn off the first transistor, a low voltage is applied to the bit line and the first wiring, and a high voltage is applied to the capacitor line to turn off the second transistor. Operation of reading data comprises a third step and a fourth step. In the third step, a high voltage is applied to the first wiring. In the fourth step, application of the high voltage to the first wiring is stopped, and a low voltage is applied to the capacitor line. By the second step, a voltage corresponding to the first voltage is applied to the gate of the second transistor from the first wiring through the source and the drain of the second transistor, the bit line, and the source and the drain of the first transistor. By the fourth step, a voltage of the first wiring changes from the high voltage to the first voltage.

One embodiment of the present invention is a semiconductor device which includes a first transistor, a second transistor, a third transistor, and a capacitor. A region in which a channel of the first transistor is formed comprises an oxide semiconductor film. A gate of the first transistor is electrically connected to a first word line. One of a source and a drain of the first transistor is electrically connected to a bit line. The other of the source and the drain of the first transistor is electrically connected to one electrode of the capacitor and a gate of the second transistor. A low voltage is applied to the other electrode of the capacitor. One of a source and a drain of the second transistor is electrically connected to a first wiring. The other of the source and the drain of the second transistor is electrically connected to one of a source and a drain of the third transistor. A gate of the third transistor is electrically connected to a second word line. The other of the source and the drain of the third transistor is electrically connected to the bit line. Operation of writing data comprises a first step and a second step. In the first step, a low voltage is applied to the bit line and the first wiring, a high voltage is applied to the first word line to turn on the first transistor, the low voltage of the bit line is applied to the gate of the second transistor to turn on the second transistor, and a low voltage is applied to the second word line to turn on the third transistor. In the second step, the first voltage is applied to the first wiring, and application of the low voltage to the bit line is stopped. To store the data, a low voltage is applied to the first word line to turn off the first transistor, a low voltage is applied to the bit line and the first wiring, and a high voltage is applied to the second word line to turn off the third transistor. Operation of reading the data comprises a third step and a fourth step. In the third step, a high voltage is applied to the first wiring. In the fourth step, application of the high voltage to the first wiring is stopped, and a low voltage is applied to the second word line to turn on the third transistor. By the second step, a voltage corresponding to the first voltage is applied to the gate of the second transistor from the first wiring through the source and the drain of the second transistor, the source and the drain of the third transistor, the bit line, and the source and the drain of the first transistor. By the fourth step, a voltage of the first wiring changes from the high voltage to the first voltage.

One embodiment of the present invention is a semiconductor device which includes a first transistor, a second transistor, and a capacitor. A region in which a channel of the first transistor is formed comprises an oxide semiconductor film. A gate of the first transistor is electrically connected to a word line. One of a source and a drain of the first transistor is electrically connected to a bit line. The other of the source and the drain of the first transistor is electrically connected to one electrode of the capacitor and a gate of the second transistor. The other electrode of the capacitor is electrically connected to a capacitor line. One of a source and a drain of the second transistor is electrically connected to a first wiring. The other of the source and the drain of the second transistor is electrically connected to the bit line. Operation of writing data comprises a first step and a second step. In the first step, a high voltage is applied to the bit line and first wiring, a high voltage is applied to the word line to turn on the first transistor, and a high voltage is applied to the capacitor line, thereby turning on the second transistor. In the second step, a first voltage is applied to the first wiring, and application of the high voltage to the bit line is stopped. To store the data, a low voltage is applied to the word line to turn off the first transistor, a high voltage is applied to the bit line and the first wiring, and a low voltage is applied to the capacitor line to turn off the second transistor. Operation of reading the data comprises a third step and a fourth step. In the third step, a low voltage is applied to the first wiring. In the fourth step, application of the low voltage to the first wiring is stopped, and a high voltage is applied to the capacitor line. By the second step, a voltage corresponding to the first voltage is applied to the gate of the second transistor from the first wiring through the source and the drain of the second transistor, the bit line, and the source and the drain of the first transistor. By the fourth step, a voltage of the first wiring changes from the low voltage to the first voltage.

One embodiment of the present invention is a semiconductor device which includes a first transistor, a second transistor, a third transistor, and a capacitor. A region in which a channel of the first transistor is formed comprises an oxide semiconductor film. A gate of the first transistor is electrically connected to a first word line. One of a source and a drain of the first transistor is electrically connected to a bit line. The other of the source and the drain of the first transistor is electrically connected to one electrode of the capacitor and a gate of the second transistor. A low voltage is applied to the other electrode of the capacitor. One of a source and a drain of the second transistor is electrically connected to a first wiring. The other of the source and the drain of the second transistor is electrically connected to one of a source and a drain of the third transistor. A gate of the third transistor is electrically connected to a second word line. The other of the source and the drain of the third transistor is electrically connected to the bit line. Operation of writing data comprises a first step and a second step. In the first step, a high voltage is applied to the bit line and the first wiring, a high voltage is applied to the first word line to turn on the first transistor, the high voltage of the bit line is applied to the gate of the second transistor to turn on the second transistor, and a high voltage is applied to the second word line to turn on the third transistor. In the second step, the first voltage is applied to the first wiring, and application of the high voltage to the bit line is stopped. To store the data, a low voltage is applied to the first word line to turn off the first transistor, a high voltage is applied to the bit line and the first wiring, and a low voltage is applied to the second word line to turn off the third transistor. Operation of reading the data comprises a third step and a fourth step. In the third step, a low voltage is applied to the first wiring. In the fourth step, a high voltage is applied to the second word line to turn on the third transistor, and application of the low voltage to the first wiring is stopped. By the second step, a voltage corresponding to the first voltage is applied to the gate of the second transistor from the first wiring through the source and the drain of the second transistor, the source and the drain of the third transistor, the bit line, and the source and the drain of the first transistor. By the fourth step, a voltage of the first wiring changes from the low voltage to the first voltage.

One embodiment of the present invention is a method for driving a semiconductor device. The semiconductor device includes a first transistor whose channel region includes an oxide semiconductor, a second transistor, and a capacitor whose one electrode electrically connected to one of a source and a drain of the first transistor and a gate of the second transistor. In the method, a first voltage is applied to a bit line and a first wiring, a second voltage is applied to a word line to turn on the first transistor, and a third voltage is applied to a capacitor line, thereby turning on the second transistor. The word line is electrically connected to a gate of the first transistor. The first wiring is electrically connected to one of a source and a drain of the second transistor. The bit line is electrically connected to the other of the source and the drain of the first transistor and the other of the source and the drain of the second transistor. The capacitor line is electrically connected to the other electrode of the capacitor. In the method, a fourth voltage is applied to the first wiring and the application of the first voltage to the bit line is stopped so that a voltage corresponding to the fourth voltage is applied to the gate of the second transistor from the first wiring through the source and the drain of the second transistor, the bit line, and the source and the drain of the first transistor. A fifth voltage is applied to the word line to turn off the first transistor, a sixth voltage is applied to the bit line and the first wiring, and a seventh voltage is applied to the capacitor line to turn off the second transistor. An eighth voltage is applied to the first wiring. The application of the eighth voltage to the first wiring is stopped, and a ninth voltage is applied to the capacitor line so that a voltage of the first wiring changes from the eighth voltage to the fourth voltage.

In the one embodiment of the present invention, the second voltage is preferably higher than the fifth voltage. The seventh voltage is preferably higher than the third voltage and the ninth voltage. The first voltage and the sixth voltage are preferably a power supply voltage or a reference voltage. The eighth voltage is preferably higher than the fourth voltage.

In the one embodiment of the present invention, the second voltage is preferably higher than the fifth voltage. The seventh voltage is preferably lower than the third voltage and the ninth voltage. The first voltage, the sixth voltage, and the eighth voltage are preferably a power supply voltage or a reference voltage.

One embodiment of the present invention is a method for driving a semiconductor device. The semiconductor device includes a first transistor whose channel region includes an oxide semiconductor, a second transistor, a third transistor, and a capacitor whose one electrode electrically connected to one of a source and a drain of the first transistor and a gate of the second transistor. In the method, a first voltage is applied to a bit line and a first wiring, a second voltage is applied to a first word line to turn on the first transistor, the first voltage of the bit line is applied to the gate of the second transistor to turn on the second transistor, and a third voltage is applied to a second word line to turn on the third transistor. The first word line is electrically connected to a gate of the first transistor. The second word line is electrically connected to a gate of the third transistor. The first wiring is electrically connected to one of a source and a drain of the second transistor. One of a source and a drain of the third transistor is electrically connected to the other of the source and the drain of the second transistor. The bit line is electrically connected to the other of the source and the drain of the first transistor and the other of the source and the drain of the third transistor. The other electrode of the capacitor is electrically connected to a reference potential terminal or a power supply potential terminal. In the method, a fourth voltage is applied to the first wiring, and the application of the first voltage to the bit line is stopped so that a voltage corresponding to the fourth voltage is applied to the gate of the second transistor from the first wiring through the source and the drain of the second transistor, the source and the drain of the third transistor, the bit line, and the source and the drain of the first transistor. A fifth voltage is applied to the first word line to turn off the first transistor, a sixth voltage is applied to the bit line and the first wiring, and a seventh voltage is applied to the second word line to turn off the third transistor. An eighth voltage is applied to the first wiring. The application of the eighth voltage to the first wiring is stopped, and a ninth voltage is applied to the second word line to turn on the third transistor so that a voltage of the first wiring changes from the eighth voltage to the fourth voltage.

In the one embodiment of the present invention, the second voltage is preferably higher than the fifth voltage. The seventh voltage is preferably higher than the third voltage and the ninth voltage. The sixth voltage is preferably a power supply voltage or a reference voltage.

In the one embodiment of the present invention, the second voltage is preferably higher than the fifth voltage. The seventh voltage is preferably lower than the third voltage and the ninth voltage. The sixth voltage and the eighth voltage are preferably a power supply voltage or a reference voltage.

A semiconductor device of one embodiment of the present invention can have a smaller variation in a read voltage. A semiconductor device of one embodiment of the present invention does not need a verify operation. A semiconductor device of one embodiment of the present invention shows high retention characteristics in storing multi-bit data and high reliability.

BEST MODE FOR CARRYING OUT THE INVENTION

Figure 1:
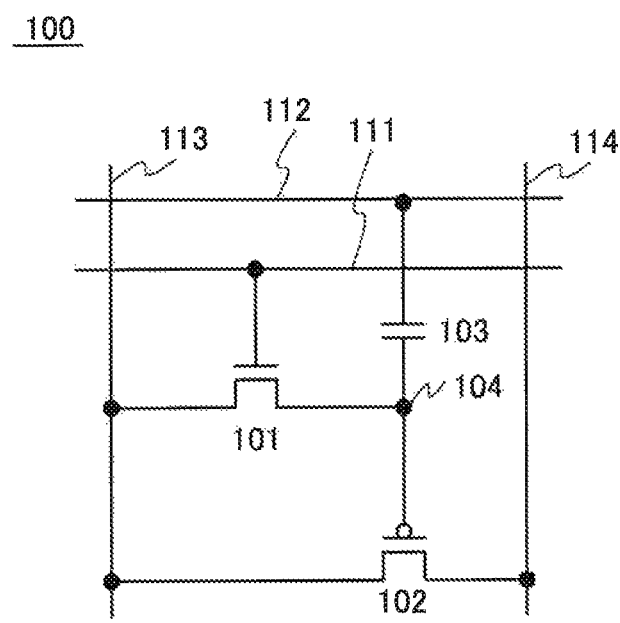
FIG. 1 is a circuit diagram of a semiconductor device.

Embodiments and examples of the present invention will be described below with reference to the drawings. Note that the present invention is not limited to the following description. It will be readily appreciated by those skilled in the art that various changes and modifications are possible without departing from the spirit and the scope of the present invention. Therefore, the present invention should not be construed as being limited to the following description of the embodiments. Note that in describing the structure of the present invention with reference to the drawing, reference numerals denoting the same portions are used in different drawings in common.

In this specification, the term "connection" means electrical connection and corresponds to the state in which current, voltage, or a potential can be supplied or transmitted. Accordingly, a connection state means not only a state of direct connection but also a state of electrical connection through a circuit element such as a wiring, a resistor, a diode, or a transistor so that current, voltage, or a potential can be supplied or transmitted.

Although the block diagram attached to this specification shows components classified by their functions in independent blocks, it is difficult to classify actual components according to their functions completely and it is possible for one component to have a plurality of functions.

Note that a "source" of a transistor means a source region that is part of a semiconductor film functioning as an active layer or a source electrode electrically connected to the semiconductor film. Similarly, a "drain" of a transistor means a drain region that is part of a semiconductor film functioning as an active layer or a drain electrode electrically connected to the semiconductor film. A "gate" means a gate electrode.

The terms "source" and "drain" of a transistor interchange with each other depending on the type of the channel of the transistor or levels of potentials applied to the terminals. In general, in an n-channel transistor, a terminal to which a lower potential is applied is called a source, and a terminal to which a higher potential is applied is called a drain. Further, in a p-channel transistor, a terminal to which a lower potential is applied is called a drain, and a terminal to which a higher potential is applied is called a source. In this specification, although connection relation of the transistor is described assuming that the source and the drain are fixed in some cases for convenience, actually, the names of the source and the drain interchange with each other depending on the relation of the potentials.

Note that what is described (or part thereof) in one embodiment can be applied to, combined with, or exchanged with another content in the same embodiment and/or what is described (or part thereof) in another embodiment or other embodiments.

Note that the size, the thickness of layers, or regions in diagrams is sometimes exaggerated for simplicity. Therefore, embodiments of the present invention are not limited to such a scale.

Note that drawings are schematic views of ideal examples, and the embodiments of the present invention are not limited to the shape or the value illustrated in the drawings. For example, the following can be included: variation in shape due to a manufacturing technique or dimensional deviation; or variation in signal, voltage, or current due to noise or difference in timing.

A voltage usually refers to a potential difference between a given potential and a reference potential (e.g., a source potential or a ground potential (GND)). A voltage can be referred to as a potential and vice versa. Here, the voltage of each wiring or each terminal is relative voltage, and whether the voltage is higher or lower than reference voltage is important. Thus, GND does not necessarily mean 0 V. The same applies to the drawings, and GND in the drawings does not necessarily mean 0 V.

Even when the expression "electrically connect" is used in this specification, in an actual circuit, there is a case in which no physical connection is made and a wiring is just extended.

Note that the ordinal numbers such as "first" and "second" in this specification are used for the sake of convenience and do not denote the order of steps or the stacking order of layers. In addition, the ordinal numbers in this specification do not denote particular names which specify the present invention.

Note that a "semiconductor" includes characteristics of an "insulator" in some cases when the conductivity is sufficiently low, for example. Further, a "semiconductor" and an "insulator" cannot be strictly distinguished from each other in some cases because a border between the "semiconductor" and the "insulator" is not clear. Accordingly, a "semiconductor" in this specification can be called an "insulator" in some cases. Similarly, an "insulator" in this specification can be called a "semiconductor" in some cases.

Further, a "semiconductor" includes characteristics of a "conductor" in some cases when the conductivity is sufficiently high, for example. Further, a "semiconductor" and a "conductor" cannot be strictly distinguished from each other in some cases because a border between the "semiconductor" and the "insulator" is not clear. Accordingly, a "semiconductor" in this specification can be called a "conductor" in some cases. Similarly, a "conductor" in this specification can be called a "semiconductor" in some cases.

In this specification, a term "parallel" indicates that the angle formed between two straight lines is greater than or equal to −10° and less than or equal to 10°, and accordingly also includes the case where the angle is greater than or equal to −5° and less than or equal to 5°. In addition, a term "perpendicular" indicates that the angle formed between two straight lines is greater than or equal to 80° and less than or equal to 100°, and accordingly includes the case where the angle is greater than or equal to 85° and less than or equal to 95°.

In this specification, trigonal and rhombohedral crystal systems are included in a hexagonal crystal system.

Embodiment 1

FIG. 1 illustrates a semiconductor device 100. The semiconductor device 100 includes a transistor 101, a transistor 102, and a capacitor 103. The semiconductor device 100 can function as a memory cell and is also referred to as a memory cell 100.

A region in which a channel of the transistor 101 is formed includes an oxide semiconductor layer. The transistor 101 includes the oxide semiconductor layer. Accordingly, off-state current of the transistor 101 is extremely low.

The transistor 101 is an n-channel transistor or a p-channel transistor. The following description is made on the case where the transistor 101 is an n-channel transistor.

A gate of the transistor 101 is electrically connected to a wiring 111. The wiring 111 can function as a word line.

One of a source and a drain of the transistor 101 is electrically connected to a wiring 113. The wiring 113 can function as a bit line.

The other of the source and the drain of the transistor 101 is electrically connected to one electrode of the capacitor 103. The other of the source and the drain of the transistor 101 is electrically connected to a gate of the transistor 102.

A layer containing various materials such as an oxide semiconductor and silicon can be used for a region in which a channel of the transistor 102 is formed. The transistor 102 is a p-channel transistor.

One of a source and a drain of the transistor 102 is electrically connected to a wiring 114. The wiring 114 can function as a signal line, a source line, or a power supply line.

The other of the source and the drain of the transistor 102 is electrically connected to the wiring 113. The other of the source and the drain of the transistor 102 is electrically connected to the one of the source and the drain of the transistor 101.

The one electrode of the capacitor 103 is electrically connected to the other of the source and the drain of the transistor 101. The one electrode of the capacitor 103 is electrically connected to the gate of the transistor 102.

The other electrode of the capacitor 103 is electrically connected to a wiring 112. The wiring 112 can function as a capacitor line.

Operation of writing data to the semiconductor device 100 and operation of reading data from the semiconductor device 100 will be described.

(Write Operation)

Figure 2:
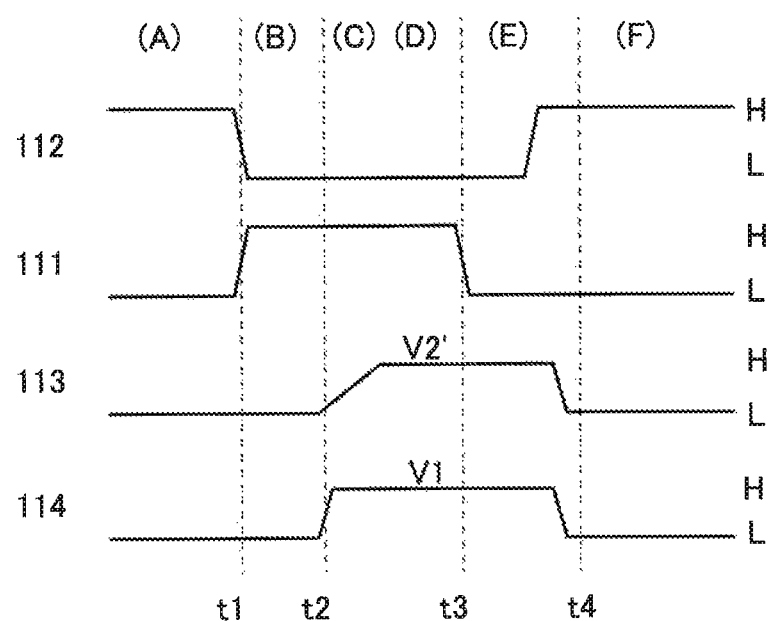
FIG. 2 is a timing diagram.

First, one example of the write operation is described. FIG. 2 is a timing diagram. FIGS. 3A to 3E illustrate operation of the semiconductor device 100. As one example, a voltage to be read is referred to as V1, and operation of writing data by changing the potential of anode 104 (the gate potential of the transistor 102) to V2 is described. Since various voltages need to be applied in storing multi-bit data, it is advantageous in that V1 can be set freely.

Operation of writing data is performed by a first step and a second step. In the first step, a low voltage is applied to the wirings 113 and 114, a high voltage is applied to the wiring 111 to turn on the transistor 101, and a low voltage is applied to the wiring 112, thereby turning on the transistor 102. In the second step, the voltage V1 is applied to the wiring 114, and the application of the low voltage to the wiring 113 is stopped.

Owing to the second step, a potential V2 corresponding to data (the voltage V1) is applied to the node 104 from the wiring 114 through the source and the drain of the transistor 102, the wiring 113, and the source and the drain of the transistor 101. Then, the potential V2 is applied to the gate of the transistor 102. Electric charge corresponding to V2 is accumulated in the capacitor 103.

Figure 3A:
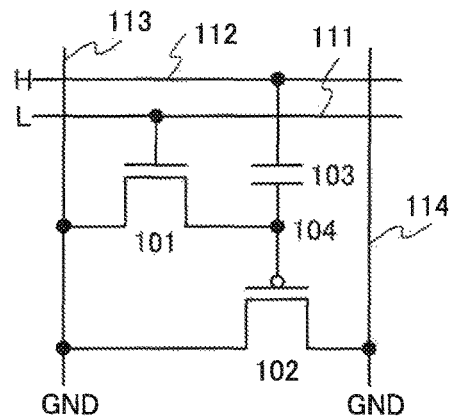
FIGS. 3A to 3E show operation of a semiconductor device.

FIG. 3A shows an initial state of the semiconductor device 100. In FIG. 2, the initial state is shown by (A).

A signal at a low voltage (also referred to as L voltage) is input to the wiring 111, and thus, the transistor 101 is off. The low voltage is a voltage at which the transistor 101 is turned off. The low voltage may be a reference voltage (GND), a power supply voltage (VDD or VSS), or another voltage.

A signal at a high voltage (also referred to as H voltage) is input to the wiring 112. A voltage corresponding to the capacitance value of the capacitor 103 is applied to the node 104, and thus, the transistor 102 is off. The high voltage is a voltage at which the transistor 102 is turned off. The high voltage may be a power supply voltage (VDD) or another voltage.

A low voltage (GND) is applied to the wirings 113 and 114. Accordingly, the low voltage can be precharged to the wirings 113 and 114. The low voltage is the reference voltage (GND) here but may be a power supply voltage (VSS) or another voltage.

Figure 3B:
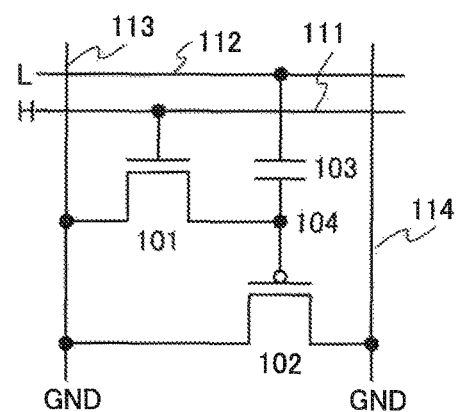

FIG. 3B shows a writing preparation state. In FIG. 2, the state is shown by (B).

In time t1, a signal at a high voltage is input to the wiring 111, and thus, the transistor 101 is turned on. The high voltage is a voltage at which the transistor 101 is turned on. The high voltage may be a power supply voltage (VDD) or another voltage.

The transistor 101 is turned on, so that the wiring 113 and the node 104 are electrically connected. The potential of the node 104 is lowered to be the low voltage (GND).

In the time t1, a signal at a low voltage is input to the wiring 112. A voltage corresponding to the capacitance value of the capacitor 103 is applied to the node 104. The transistor 101 is turned on and a low voltage is applied to the wiring 112, so that the transistor 102 is turned on. The low voltage is a voltage at which the transistor 102 is turned on. The low voltage may be a reference voltage (GND), the power supply voltage (VSS), or another voltage.

A low voltage is applied to the wirings 113 and 114, and the transistors 101 and 102 are turned on. The first step is completed.

Figure 3C:
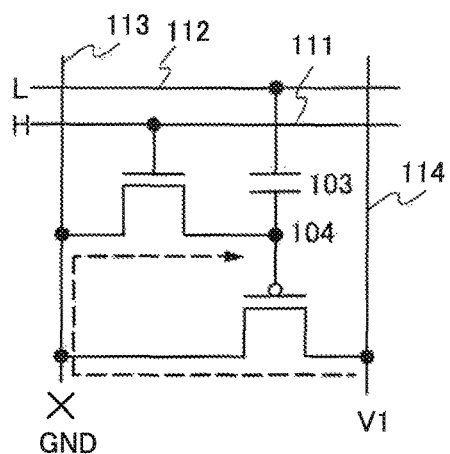
Figure 3D:
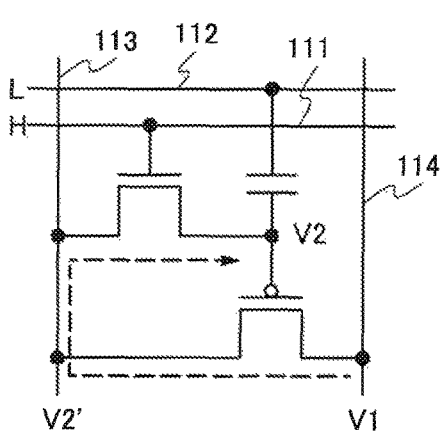

FIGS. 3C and 3D show a write state. In FIG. 2, the state is shown by (C) and (D).

In time t2, the voltage V1 is applied to the wiring 114 (FIG. 3C). The voltage V1 is a voltage to be read by a read operation. The level of V1 can be set freely depending on data to be written.

In the time t2, supply of the low voltage (GND) to the wiring 113 is stopped (FIG. 3C). At this time, the wiring 113 is electrically in a floating state from the precharged voltage. That is, the potential of the wiring 113 is easily changed by charge or discharge of electric charge. This floating state can be obtained by turning off the switch for supplying the potential of the wiring 113.

Since the transistor 102 is on, the wiring 113 is electrically connected to the wiring 114. The voltage of the wiring 113 is changed from the precharged low voltage (GND) to V2' (FIG. 3D). Note that the difference between V2' and V1 is about the threshold voltage of the transistor 102.

Since the transistor 101 is on, data is written to the node 104 (the gate of the transistor 102) from the wiring 114 through the source and the drain of the transistor 102, the wiring 113, and the source and the drain of the transistor 101. Electric charge is accumulated in the capacitor 103. The potential of the node 104 is changed to V2.

The potential of the node 104 is changed to V2, and accordingly, a potential difference between the gate of the transistor 102 and the source of the transistor 102 becomes small; as a result, current (Id) flowing between the source and the drain of the transistor 102 becomes low. The transistor 102 is lastly turned off.

In the semiconductor device 100, V1, V2', and V2 are applied to the wiring 114, the wiring 113, and the node 104, respectively.

The voltage V1 is applied to the wiring 114 and the application of the low voltage to the wiring 113 is stopped, so that the second step is completed.

Through the above steps, the voltage V1 to be read is applied to the wiring 114 and the potential of the node 104 is changed to V2, so that the write operation is completed.

Figure 3E:
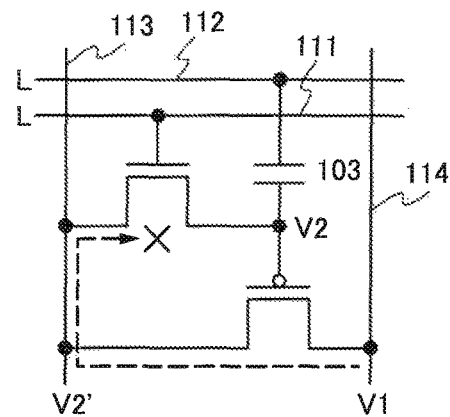

FIG. 3E shows a state after the write operation and before data retention. In FIG. 2, the state is shown by (E).

In time t3, a signal at a low voltage is input to the wiring 111. The transistor 101 is turned off. The node 104 and the wiring 113 are electrically disconnected. The transistor 101 has a characteristic of extremely low off-state current, and therefore, the potential (V2) of the node 104 is retained.

By time t4, the high voltage is applied to the wiring 112, the low voltage (GND) is applied to the wiring 113, and the low voltage (GND) is applied to the wiring 114.

The high voltage is applied to the wiring 112, so that the potential of the node 104 is changed from V2 to a voltage at which the transistor 102 is turned off.

In the time t4, the state becomes the retention state. In FIG. 2, the state is shown by (F). The state of the semiconductor device 100 is the same as the state of the semiconductor device 100 in FIG. 3A except that the nodes 104 have different potentials. The transistor 101 is off.

Note that a low voltage is applied to the wiring 114 in (A) and (F) in FIG. 2, but a high voltage may be applied to the wiring 114 in (A) and (F) in FIG. 2. If a high voltage is applied to the wiring 114, when the state is changed from the state (E) to the state (F), i.e., when a high voltage is applied to the wiring 114, the voltage can be quickly changed in some cases.

(Read Operation)

Figure 4:
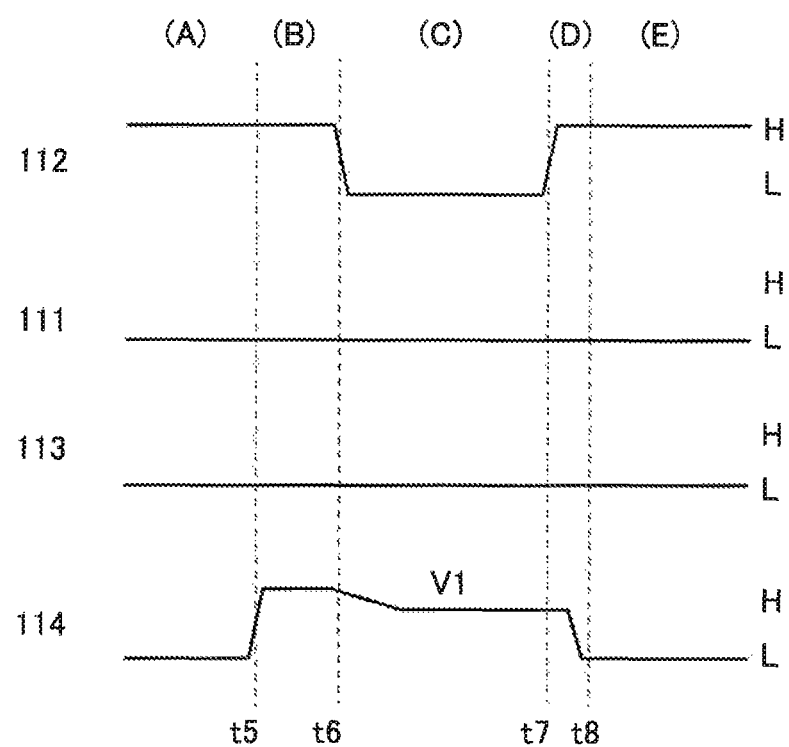
FIG. 4 is a timing diagram.

Next, one example of operation for reading the voltage V1 on the basis of electric charge written through the write operation is described. FIG. 4 is a timing diagram. FIGS. 5A to 5D show operation of the semiconductor device 100.

Operation for reading data is performed by a third step in which a high voltage is applied to the wiring 114 and a fourth step in which the application of the high voltage to the wiring 114 is stopped and a low voltage is applied to the wiring 112. By the fourth step, the voltage of the wiring 114 is changed from the high voltage to the voltage V1.

Figure 5A:
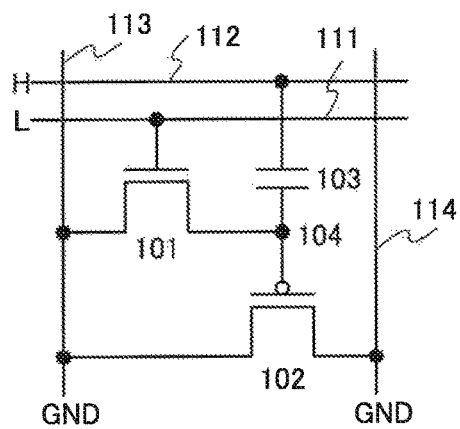
FIGS. 5A to 5D show operation of a semiconductor device.

FIG. 5A shows a retention state of the semiconductor device 100. In FIG. 4, the retention state is shown by (A).

Figure 5B:
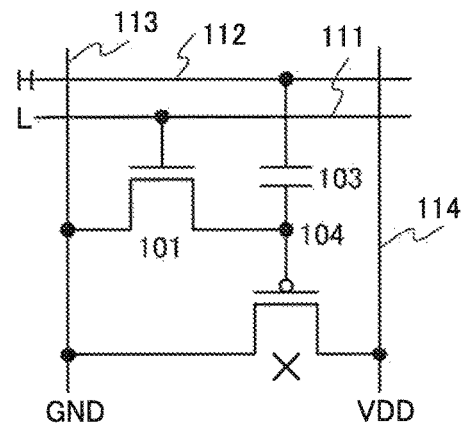

FIG. 5B shows a reading preparation state. In FIG. 4, the state is shown by (B).

In the time t5, a high voltage (VDD) is applied to the wiring 114. The high voltage can be precharged to the wiring 114. The high voltage is the power supply voltage (VDD) here, but may be another voltage. The high voltage is preferably higher than V1.

Note that the transistors 101 and 102 remain off from the retention state.

The high voltage is applied to the wiring 114, so that the third step is completed.

Figure 5C:
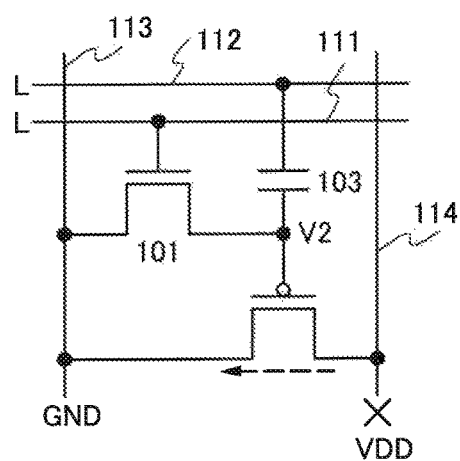
Figure 5D:
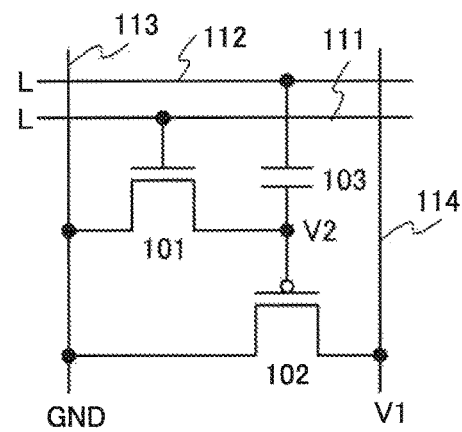

FIGS. 5C and 5D show a read state. In FIG. 4, the state is shown by (C).

In time t6, supply of the high voltage (VDD) to the wiring 114 is stopped (FIG. 5C). At this time, the wiring 114 is electrically in a floating state from the precharged voltage. That is, the potential of the wiring 114 is easily changed by charge and discharge of electric charge. This floating state can be obtained by turning off the switch for supplying the potential of the wiring 114.

In the time t6, a signal at a low voltage is input to the wiring 112. The potential of the node 104 is changed to V2 in writing data. As a result, current (Id) corresponding to the gate potential of the transistor 102 (V2) and the potential of the wiring 114 flows. Note that the low voltage input to the wiring 112 is preferably equal to the low voltage input to the wiring 112 in the write operation.

The potential of the wiring 114 changes from the precharged high voltage (VDD) to V1 in response to the gate voltage V2 (FIG. 5D). A potential difference between the gate and the source of the transistor 102 becomes smaller over time, and consequently, the transistor 102 is turned off.

The wiring 114 is electrically connected to a discrimination circuit or the like to read V1. Accordingly, the voltage V1 can be read.

Application of the high voltage to the wiring 114 is stopped and the low voltage is applied to the wiring 112. Accordingly, the fourth step is completed.

After data is read, in time t7, a signal at a high voltage is input to the wiring 112. The high voltage is applied to the wiring 112, so that the potential of the node 104 is changed from V2 by the high voltage. Accordingly, the transistor 102 is turned off.

A low voltage (GND) is applied to the wiring 114 by time t8.

At the time t8, the state is the retention state. In FIG. 4, the state is shown by (E). The semiconductor device 100 is in the state shown in FIG. 5A.

Note that a low voltage is applied to the wiring 114 in (A) and (E) in FIG. 4, but a high voltage may be applied to the wiring 114 in (A) and (E) in FIG. 4. If a high voltage is applied to the wiring 114, when the state is changed from the state (A) to the state (B), i.e., when VDD is applied to the wiring 114, the voltage can be quickly changed.

Note that in the case where the potential of the node 104, that is, the potential applied to the gate of the transistor 102 is reset, for example, the low voltage is applied to the wiring 112 and a signal at a high voltage is input to the wiring 111. Accordingly, the transistor 101 is turned on, so that the node 104 is electrically connected to the wiring 113. Since GND is applied to the wiring 113, the potential of the node 104 is reset.

In this embodiment, the potential (V1) applied to the wiring 114 in writing data serves as a reading potential.

In a conventional technique, a read voltage has had a distribution. For example, owing to effects of variation in the threshold value of a reading transistor, or the like, an actual read voltage has been V1±ΔV even in the case where V1 is to be read. That is, the read voltage has had the spread of ΔV. On the other hand, in this embodiment, a desired potential V1 applied to the wiring 114 can be read. Accordingly, ΔV can be smaller, and thus, the spread of the distribution of the read voltage can be squeezed.

In the case where multi-bit data is stored to the semiconductor device 100, it is necessary to correctly write and read a predetermined voltage. Therefore, high accuracy is required. In this embodiment, it is possible to apply a predetermined potential and read the potential. Accordingly, in the case of storing multi-bit data, the semiconductor device 100 shows high retention characteristics and high reliability.

A verify operation has been conventionally performed to check whether data is correctly written. On the other hand, in this embodiment, it is not necessary to perform a verify operation. Thus, high-speed operation can be achieved.

This embodiment can be implemented in combination with any of the other embodiments in this specification as appropriate.

Embodiment 2

In this embodiment, one example of a semiconductor device capable of using a driving method which is described with reference to FIG. 1 will be described. Hereinafter description is made with reference to FIG. 6, FIG. 7, FIG. 8, FIG. 9, FIG. 10, FIG. 11, and FIG. 12.

(Structure Example of Semiconductor Device)

Figure 6:
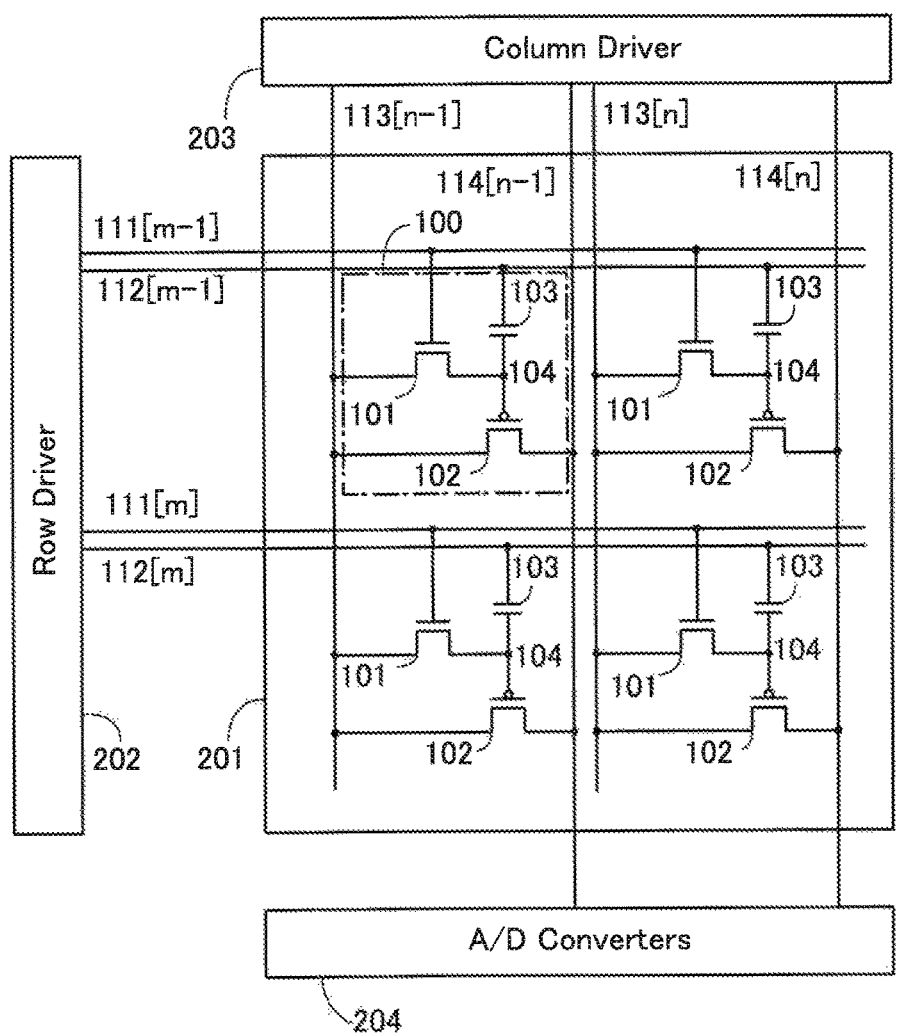
FIG. 6 is a circuit diagram of a semiconductor device.

FIG. 6 is a block diagram of a structure example of a semiconductor device 200 including the memory cell 100 described with reference to FIG. 1.

The semiconductor device 200 illustrated in FIG. 6 includes a memory cell array 201 in which the plurality of memory cells 100 described with reference to FIG. 1 are provided, a row selection driver 202, a column selection driver 203, and an A/D converter 204. Note that the semiconductor device 200 includes the memory cells 100 arranged in a matrix with m rows and n columns. In FIG. 6, as the wiring 111, a wiring 111[m−1] in the (m−1)th row and a wiring 111[m] in the m-th row are provided. As the wiring 112, a wiring 112[m−1] in the (m−1)th row and a wiring 112[m] in the m-th row are provided. As the wiring 113, a wiring 113[n−1] in the (n−1) column and a wiring 113 [n] in the n-th column are provided. As the wiring 114, a wiring 114[n−1] in the (n−1) column and a wiring 114[n] in the n-th column are provided.

In the memory cell array 201 illustrated in FIG. 6, the memory cells 100 described with reference to FIG. 1 are arranged in matrix. Note that the description of the components included in the memory cell 100 is the same as that in FIG. 1, and thus, is omitted. The description with reference to FIG. 1 is referred to.

The row selection driver 202 is a circuit which has functions of selectively turning on the transistors 101 in each row of the memory cells 100 and selectively changing the potential of the node 104 in each row of the memory cells 100. Specifically, the row selection driver 202 is a circuit which supplies signals to the wirings 111 and supplies signals to the wirings 112. The row selection driver 202 allows the semiconductor device 200 to write data to or read data from the memory cells 100 in every selected row.

The column selection driver 203 is a circuit which has functions of precharging potentials of the wirings 113 and the wirings 114 in the memory cells 100, initializing the potentials of the wirings 113 and the wirings 114, and bringing the wirings 113 and the wirings 114 into an electrically floating state. The column selection driver 203 allows the semiconductor device 200 to select a column to write data to or read data from the memory cells 100 in every selected column.

The A/D converter 204 is a circuit which has functions of converting the potentials of the wirings 114, which are analog values, into digital values and outputting the digital values outside. Specifically, the A/D converter 204 is a circuit which includes a flash A/D converter. The A/D converter 204 allows the semiconductor device 200 to output the potential of the wiring 114 corresponding to data read from the memory cell 100 outside.

Note that the A/D converter 204 is described as a flash A/D converter. However, the A/D converter 204 may be a successive approximation A/D converter, a multi-slope A/D converter, or a delta-sigma A/D converter.

(Structure Example of Row Selection Driver)

Figure 7:
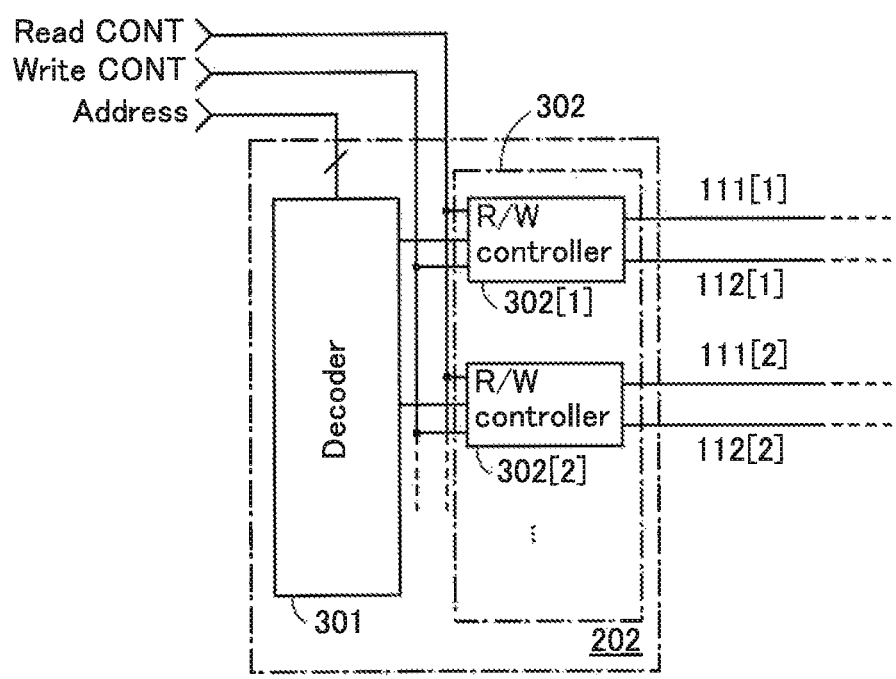
FIG. 7 is a circuit diagram of a row selection driver.

FIG. 7 is a block diagram illustrating a structure example of the row selection driver 202 described with reference to FIG. 6.

The row selection driver 202 illustrated in FIG. 7 includes a decoder 301 and a control circuit 302. The control circuit 302 is provided for each row in which the wiring 111 and the wiring 112 are provided. The control circuit 302[1] (R/W controller in FIG. 7) is provided in the first row. The control circuit 302[2] is provided in the second row. The control circuit 302 in each row is connected to the wiring 111 and the wiring 112.

The decoder 301 is a circuit which has a function of outputting a signal for selecting a row in which the wiring 111 and the wiring 112 are provided.

The control circuit 302 is a circuit which has a function of outputting a signal to the row, which is selected by the decoder 301 and in which the wiring 111 and the wiring 112 are provided.

(Structure Example of Column Selection Driver)

Figure 8:
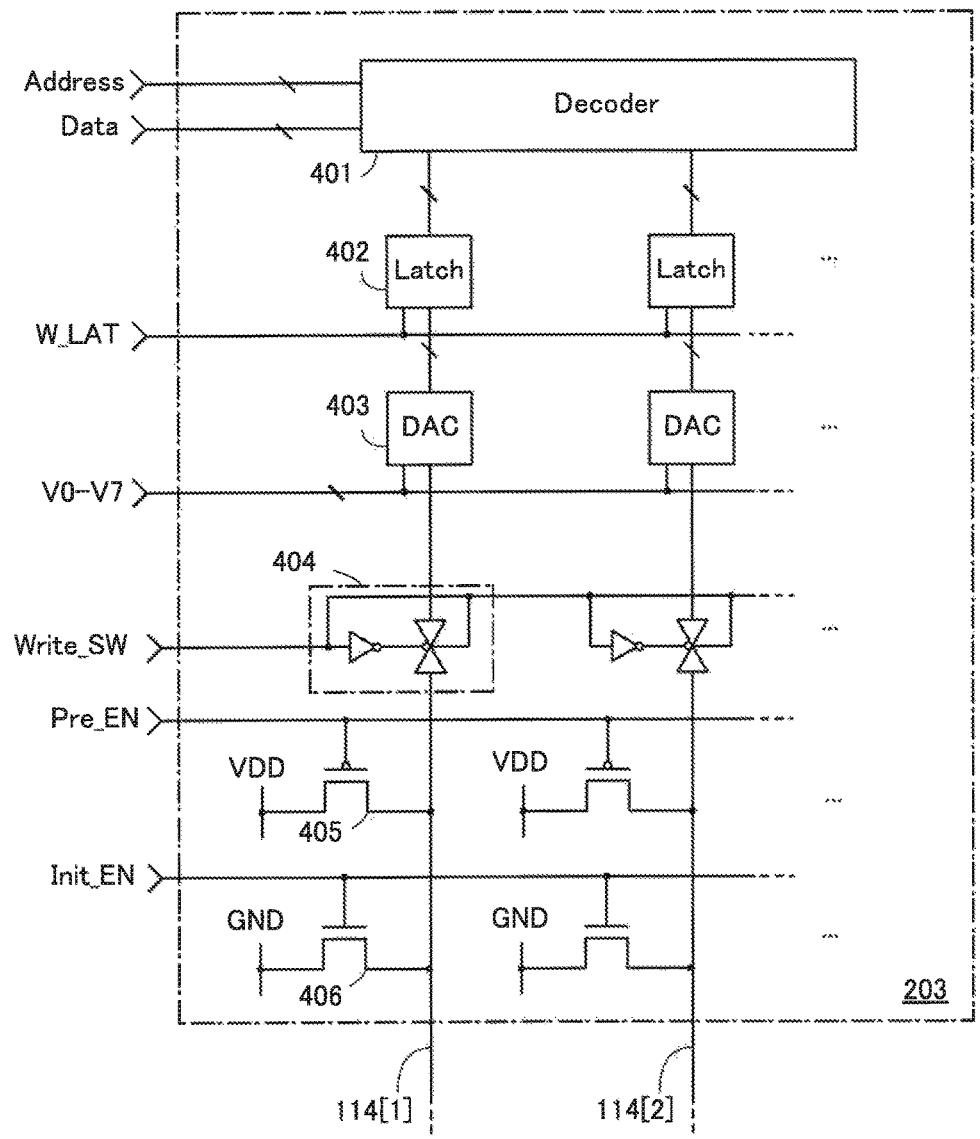
FIG. 8 is a circuit diagram of a column selection driver.

FIG. 8 is a block diagram illustrating a structure example of the column selection driver 203 described with reference to FIG. 6.

The column selection driver 203 illustrated in FIG. 8 includes a decoder 401, a latch circuit 402, a D/A converter 403, a switch circuit 404, a transistor 405, and the transistor 406. The latch circuit 402, the switch circuit 404, the transistor 405, and the transistor 406 are provided in each column. The switch circuit 404, the transistor 405, and the transistor 406 in each column are connected to the wiring 114.

The decoder 401 is a circuit which has functions of selecting a column in which the wiring 114 is provided and distributing input data to output the data. Specifically, the decoder 401 is a circuit to which an address signal "Address" and data "Data" are input and which outputs the data "Data" to the latch circuit 402 in a row in accordance with the address signal "Address". The decoder 401 allows the column selection driver 203 to select a predetermined column and write data to the column.

Note that the data "Data" input to the decoder 401 is k-bit digital data. The k-bit digital data is a signal represented by binary data, in which every bit is represented by '1' or '0'. For example, 2-bit digital data is data represented by '00', '01', '10', or '11'.

The latch circuit 402 is a circuit which has a function of temporarily storing the input data "Data". Specifically, the latch circuit 402 is a flip flop circuit to which a latch signal W_LAT is input and which stores the data "Data" in accordance with the latch signal W_LAT and outputs the data DATA to the D/A converter 403. The latch circuit 402 allows the column selection driver 203 to write data at arbitrary timing.

The D/A converter 403 is a circuit which has a function of converting the data Data, which is a digital value to be input, into data Vdata, which is an analog value. Specifically, the D/A converter 403 is a circuit which converts, for example, the 3-bit data Data into one of eight potentials (potentials V0 to V7) and outputs the potential to the switch circuit 404. The D/A converter 403 allows the column selection driver 203 to convert data written to the memory cell 100 into a potential corresponding to multilevel data.

Note that Vdata output from the D/A converter 403 is data capable of being represented by different voltage values. In the case of 2-bit data, Vdata is data with four values of 0.5 V, 1.0 V, 1.5 V, and 2.0 V, for example, and is data represented by one of the voltage values.

The switch circuit 404 is a circuit which has functions of supplying the input data Vdata to the wiring 114 and bringing the wiring 114 into an electrically floating state. Specifically, the switch circuit 404 is a circuit which includes an analog switch and an inverter and which supplies the data Vdata to the wiring 114 in accordance with a switch control signal Write_SW, and then, the analog switch is turned off to bring the wiring 114 into an electrically floating state. The switch circuit 404 allows the column selection driver 203 to keep the wiring 114 in an electrically floating state after supply of the data Vdata to the wiring 114.

The transistor 405 is a transistor which has functions of supplying a precharge voltage VDD to the wiring 114 and bringing the wiring 114 into an electrically floating state. Specifically, the transistor 405 is a switch which enables supply of the precharge voltage VDD to the wiring 114 by control with a precharge control signal Pre_EN and which brings the wiring 114 into an electrically floating state after the supply. The transistor 405 allows the column selection driver 203 to supply the precharge voltage VDD to the wiring 114, and then, to keep the wiring 114 in an electrically floating state.

The transistor 406 is a transistor which has a function of supplying an initialization voltage GND to the wiring 114. Specifically, the transistor 406 is a switch which enables supply of the initialization voltage GND to the wiring 114 by control with an initialization control signal Init_EN. The transistor 406 allows the column selection driver 203 to supply the initialization voltage GND to the wiring 114.

Note that although not illustrated, the column selection driver 203 has functions of applying a precharge voltage (GND) to the wiring 113 and bringing the wiring 113 into an electrically floating state. These functions can be achieved by a structure similar to the structure of the wiring 114; therefore, the description of the wiring 114 is referred to.

(Structure Example of A/D Converter)

Figure 9:
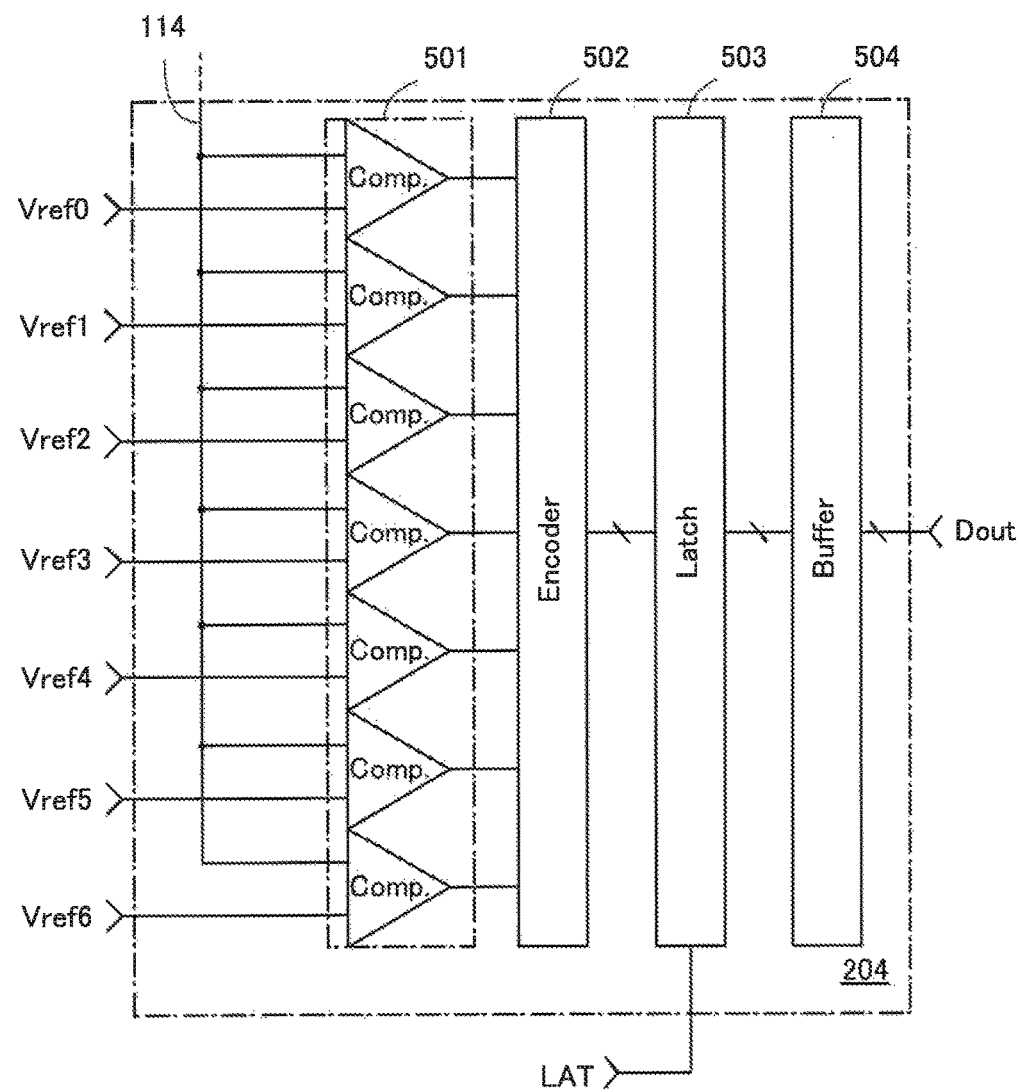
FIG. 9 is a circuit diagram of an A/D converter.

FIG. 9 is a block diagram of a structure example of the A/D converter 204 described with reference to FIG. 6.

The A/D converter 204 illustrated in FIG. 9 includes a comparator 501, an encoder 502, a latch circuit 503, and a buffer 504. The comparator 501, the encoder 502, the latch circuit 503, and the buffer 504 are provided in every column. The buffer 504 in each column outputs data D out.

The comparator 501 is a circuit which has functions of comparing potential levels between the potential of the wiring 114 and reference voltages Vref0 to Vref6 and determining whether the potential of the wiring 114 corresponds to one of multilevel data. Specifically, the comparator 501 is a circuit which includes the plurality of comparators, to which the potential of the wiring 114 and the different reference voltages Vref0 to Vref6 are supplied, and is a circuit which determines whether the potential of the wiring 114 is between the potentials. The comparator 501 allows the A/D converter 204 to determine the potential of the wiring 114 corresponds to a potential of multilevel data.

Note that as one example, the reference voltages Vref0 to Vref6 shown in FIG. 9 are potentials that are supplied in the case where multilevel data is 3-bit data, that is, 8-level data.

The encoder 502 is a circuit which has a function of generating a multibit digital signal on the basis of a signal for determining the potential of the wiring 114 which is output from the comparator 501. Specifically, the encoder 502 is a circuit which encodes a H-level or L-level signal output from the plurality of comparators to generate a digital signal. The encoder 502 allows the A/D converter 204 to convert data read from the memory cell 100 into data having a digital value.

The latch circuit 503 is a circuit which has a function of temporarily storing data of an input digital value. Specifically, the latch circuit 503 is a flip flop circuit to which a latch signal LAT is input and which outputs the data stored in accordance with the latch signal LAT to the buffer 504. The latch circuit 503 allows the A/D converter 204 to output data at arbitrary timing. Note that the latch circuit 503 can be omitted.

The buffer 504 is a circuit which has functions of amplifying data output from the latch circuit 503 and outputting the amplified data as the output signal Dout. Specifically, the buffer 504 is a circuit which includes an even number of stages of inverter circuits. The buffer 504 allows the A/D converter 204 to reduce noise of a digital signal. Note that the buffer 504 can be omitted.

(Specific Example of Driving Method of Semiconductor Device)

Figure 10:
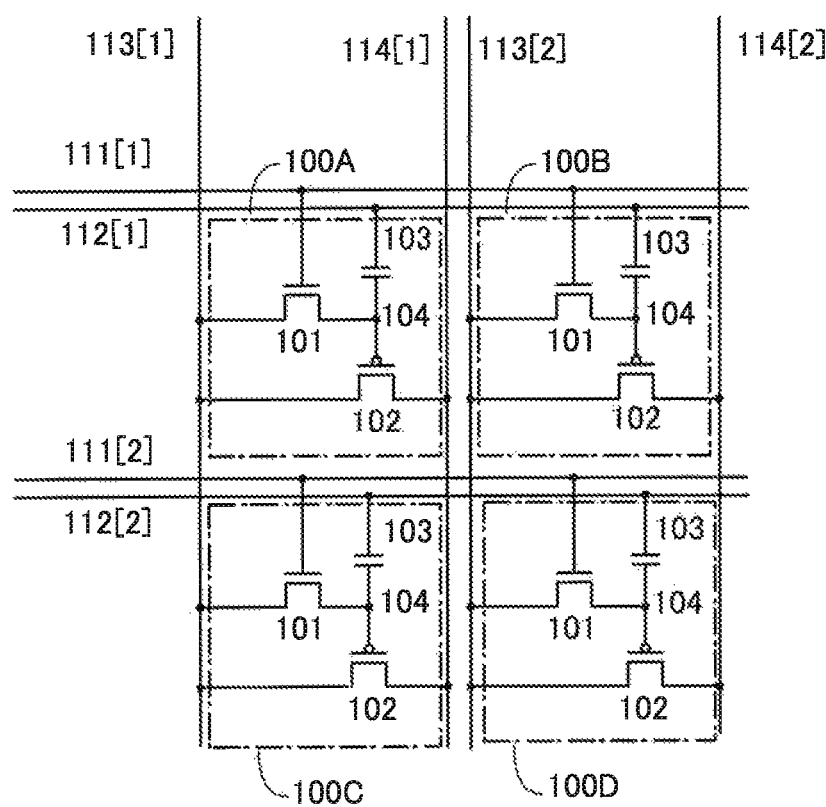
FIG. 10 is a circuit diagram of a semiconductor device.

FIG. 10 is a circuit diagram of memory cells in a semiconductor device. Timing diagrams of FIG. 11 and FIG. 12 show operation of the memory cells in FIG. 10.

In a semiconductor device 600 illustrated in FIG. 10, memory cells 100A to 100D each having the same circuit structure as that of the memory cell described with reference to FIG. 1 are arranged in a matrix with two rows and two columns. In FIG. 10, as the wiring 111, a wiring 111[1] in the first row and a wiring 111[2] in the second row are provided. As the wiring 112, a wiring 112[1] in the first row and a wiring 112[2] in the second row are provided. As the wiring 113, a wiring 113[1] in the first column and a wiring 113[2] in the second column are provided. As the wiring 114, a wiring 114[1] in the first column and a wiring 114[2] in the second column are provided.

Figure 11:
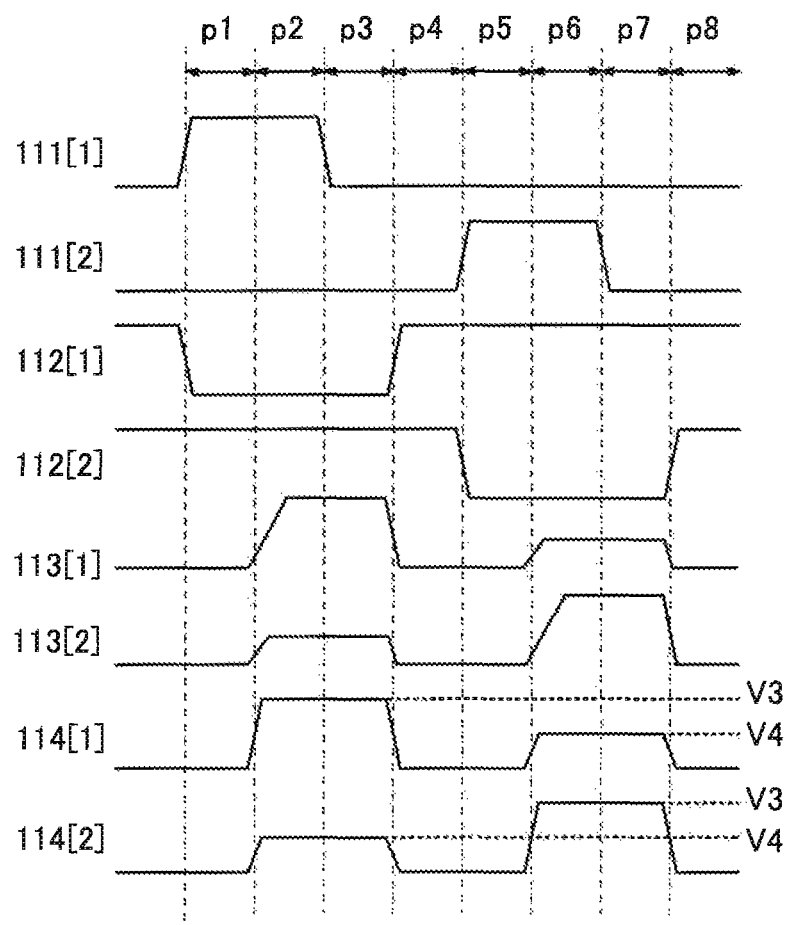
FIG. 11 is a timing diagram.
Figure 12:
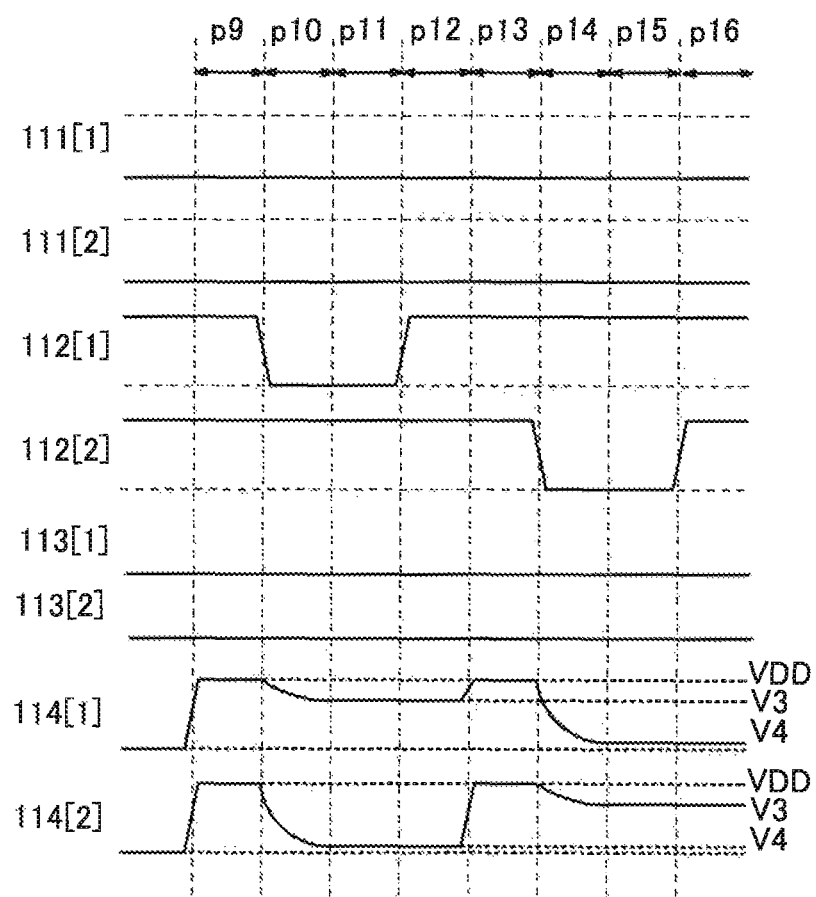
FIG. 12 is a timing diagram.

The timing diagram of FIG. 11 shows operation in periods p1 to p8 through which write of data is performed. The timing diagram of FIG. 12 shows operation in periods p9 to p16 through which read of data is performed. Note that FIG. 11 and FIG. 12 show change in the voltages of the wiring 111[1], the wiring 111[2], the wiring 112[1], the wiring 112[2], the wiring 113[1], the wiring 113[2], the wiring 114[1], and the wiring 114[2] in FIG. 10.

In the period p1 shown in FIG. 11, the wiring 111[1] is set at a H level, and the wiring 112[1] is set at a L level. Note that the other wirings (i.e., the wiring 111[2], the wiring 112[2], the wiring 113[1], the wiring 113[2], the wiring 114[1], and the wiring 114[2]) keep voltages in the previous period. The transistors 101 and the transistors 102 in the memory cells 100A and 100B are turned on.

Then, in the period p2 shown in FIG. 11, application of the voltages to the wiring 113[1] and the wiring 113 [2] is stopped to bring the wirings into an electrically floating state. The voltage of the wiring 114[1] is set to V3. The voltage of the wiring 114[2] is set to V4. Note that the other wirings (i.e., the wiring 111[1], the wiring 111[2], the wiring 112[1], and the wiring 112[2]) keep voltages in the previous period.

The voltage of the wiring 113[1] is changed owing to the voltage V3 of the wiring 114[1]. The voltage of the wiring 113[2] is changed owing to the voltage V4 of the wiring 114[2]. Data corresponding to the voltage V3 is written to the node 104 in the memory cell 100A. Data corresponding to the voltage V4 is written to the node 104 in the memory cell 100B.

Next, in the period p3 shown in FIG. 11, the potential of the wiring 111[1] is set to a L level. Note that the other wirings (i.e., the wiring 111[2], the wiring 112[1], the wiring 112[2], the wiring 113[1], the wiring 113[2], the wiring 114[1], and the wiring 114[2]) keep voltages in the previous period. The transistors 101 in the memory cells 100A and 100B are turned off.

Then, in the period p4 shown in FIG. 11, the potential of the wiring 112[1] is set to a H level. The voltages of the wiring 113[1], the wiring 113[2], the wiring 114[1], and the wiring 114[2] are made to be a low voltage (GND). Note that the other wirings (i.e., the wiring 111[1], the wiring 111[2], and the wiring 112[2]) keep voltages in the previous period. The transistors 102 in the memory cells 100A and 100B are turned off.

Next, in the period p5 shown in FIG. 11, the potential of the wiring 111[2] is set to a H level and the potential of the wiring 112[2] is set to a L level. Note that the other wirings (i.e., the wiring 111[1], the wiring 112[1], the wiring 113[1], the wiring 113[2], the wiring 114[1], and the wiring 114[2]) keep voltages in the previous period. The transistors 101 and the transistors 102 in the memory cells 100C and 100D are turned on.

Then, in the period p6 shown in FIG. 11, application of voltages to the wiring 113[1] and the wiring 113 [2] is stopped to bring the wirings into an electrically floating state. The voltage of the wiring 114[1] is set to V4. The voltage of the wiring 114[2] is set to V3. Note that the other wirings (i.e., the wiring 111[1], the wiring 111[2], the wiring 112[1], and the wiring 112[2]) keep voltages in the previous period.

The voltage of the wiring 113[1] is changed owing to the voltage V4 of the wiring 114[1]. The voltage of the wiring 113[2] is changed owing to the voltage V3 of the wiring 114[2]. Data corresponding to the voltage V4 is written to the node 104 in the memory cell 100C. Data corresponding to the voltage V3 is written to the node 104 in the memory cell 100D.

Next, in the period p7 shown in FIG. 11, the potential of the wiring 111[2] is set to a L level. Note that the other wirings (i.e., the wiring 111[1], the wiring 112[1], the wiring 112[2], the wiring 113[1], the wiring 113[2], the wiring 114[1], and the wiring 114[2]) keep voltages in the previous period. The transistors 101 in the memory cells 100C and 100D are turned off.

Then, in the period p8 shown in FIG. 11, the potential of the wiring 112[2] is set to a H level. The voltages of the wiring 113[1], the wiring 113[2], the wiring 114[1], and the wiring 114[2] are made to be a low voltage (GND). Note that the other wirings (i.e., the wiring 111[1], the wiring 111[2], and the wiring 112[1]) keep voltages in the previous period. The transistors 102 in the memory cells 100C and 100D are turned off.

As a result of writing data in the periods p1 to p8, data corresponding to the voltage V3 is written to the memory cells 100A and 100D illustrated in FIG. 10 and data corresponding to the voltage V4 is written to the memory cells 100B and 100C illustrated in FIG. 10.

In the period p9 shown in FIG. 12, the wiring 114[1] and the wiring 114[2] are supplied with a precharge voltage (here, VDD). Note that the other wirings (i.e., the wiring 111[1], the wiring 111[2], the wiring 112[1], the wiring 112[2], the wiring 113[1], and the wiring 113[2]) keep voltages in the previous period.

Then, in the period p10 shown in FIG. 12, application of the voltages to the wiring 114[1] and the wiring 114[2] is stopped to bring the wirings into an electrically floating state. The wiring 112[1] is set at a L level. The transistors 102 in the memory cells 100A and 100B are turned on. Then, the voltages of the wiring 114[1] and the wiring 114[2] are decreased owing to a voltage corresponding to data written to the memory cells 100A and 100B. The other wirings (i.e., the wiring 111[1], the wiring 111[2], the wiring 112[2], the wiring 113[1], and the wiring 113[2]) keep voltages in the previous period. Note that the voltage at a L level input to the wiring 112[1] is preferably equal to the voltage at the L level input to the wiring 112[1] in the write operation.

Next, in the period p11 shown in FIG. 12, decrease in voltages of the wiring 114[1] and the wiring 114[2] in the period p10 is stopped, so that voltages of the wiring 114[1] and the wiring 114[2] become the voltage V3 and the voltage V4, respectively. Note that the other wirings (i.e., the wiring 111[1], the wiring 111[2], the wiring 112[1], the wiring 112[2], the wiring 113[1], and the wiring 113[2]) keep voltages in the previous period.

Next, in the period p12 shown in FIG. 12, the potential of the wiring 112[1] is set to a H level. Note that the other wirings (i.e., the wiring 111[1], the wiring 111[2], the wiring 112[2], the wiring 113[1], the wiring 113[2], the wiring 114[1], and the wiring 114[2]) keep voltages in the previous period. The transistors 102 in the memory cells 100A and 100B are turned off.

In the period p13 shown in FIG. 12, the wiring 114[1] and the wiring 114[2] are supplied with the precharge voltage VDD. Note that the other wirings (i.e., the wiring 111[1], the wiring 111[2], the wiring 112[1], the wiring 112[2], the wiring 113[1], and the wiring 113[2]) keep voltages in the previous period.

Then, in the period p14 shown in FIG. 12, application of the voltages to the wiring 114[1] and the wiring 114[2] is stopped to bring the wirings into an electrically floating state. The wiring 112[2] is set at a L level. The transistors 102 in the memory cells 100C and 100D are turned on. Then, the voltages of the wiring 114[1] and the wiring 114[2] are decreased owing to a voltage corresponding to data written to the memory cells 100C and 100D. The other wirings (i.e., the wiring 111[1], the wiring 111[2], the wiring 112[1], the wiring 113[1], and the wiring 113 [2]) keep voltages in the previous period. Note that the voltage at a L level input to the wiring 112[2] is preferably equal to the voltage at the L level input to the wiring 112[2] in the write operation.

Next, in the period p15 shown in FIG. 12, decrease in voltages of the wiring 114[1] and the wiring 114[2] in the period p14 is stopped, so that voltages of the wiring 114[1] and the wiring 114[2] become the voltage V4 and the voltage V3, respectively. Note that the other wirings (i.e., the wiring 111[1], the wiring 111[2], the wiring 112[1], the wiring 112[2], the wiring 113[1], and the wiring 113[2]) keep voltages in the previous period.

Then, in the period p16 shown in FIG. 12, the potential of the wiring 112[2] is set to a H level. Note that the other wirings (i.e., the wiring 111[1], the wiring 111[2], the wiring 112[1], the wiring 113[1], the wiring 113[2], the wiring 114[1], and the wiring 114[2]) keep voltages in the previous period. The transistors 102 in the memory cells 100C and 100D are turned off.

As a result of writing data in the periods p9 to p16, data corresponding to the voltage V3 is read from the memory cell 100A and 100D illustrated in FIG. 10 and data corresponding to the voltage V4 is read from the memory cells 100B and 100C illustrated in FIG. 10.

The structure described above in this embodiment can be combined as appropriate with any of the structures described in the other embodiments.

Embodiment 3

Figure 13A:
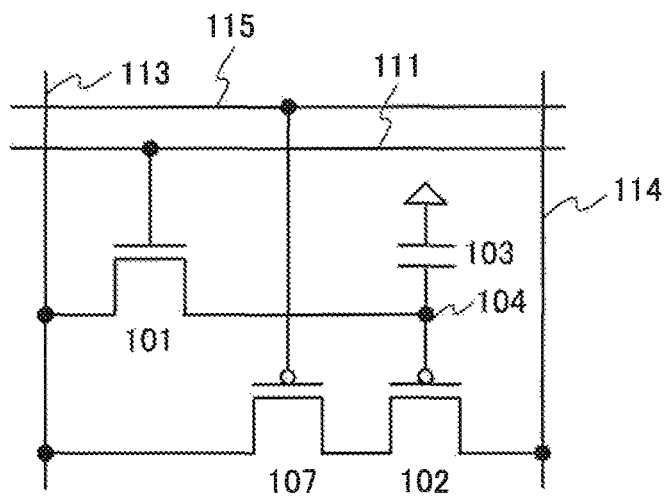
FIGS. 13A and 13B are circuit diagrams of a semiconductor device.

FIG. 13A illustrates a semiconductor device 130. The semiconductor device 130 includes the transistor 101, the transistor 102, the capacitor 103, and a transistor 107.

The semiconductor device 130 is different from the semiconductor device 100 (FIG. 1) in that the transistor 107 is included and a reference potential (GND) from a reference potential terminal is applied to the other electrode of the capacitor 103. Note that a power supply potential (VSS) from a power supply potential terminal or another potential, which is not the reference potential, may be applied to the other electrode of the capacitor 103.

The transistor 107 is a p-channel transistor. A layer containing various materials such as an oxide semiconductor and silicon can be used for a region in which a channel of the transistor 107 is formed.

A gate of the transistor 107 is electrically connected to a wiring 115. The wiring 115 can function as a word line.

One of a source and a drain of the transistor 107 is electrically connected to the other of the source and the drain of the transistor 102.

The other of the source and the drain of the transistor 107 is electrically connected to the wiring 113. The other of the source and the drain of the transistor 107 is electrically connected to the one of the source and the drain of the transistor 101.

Figure 13B:
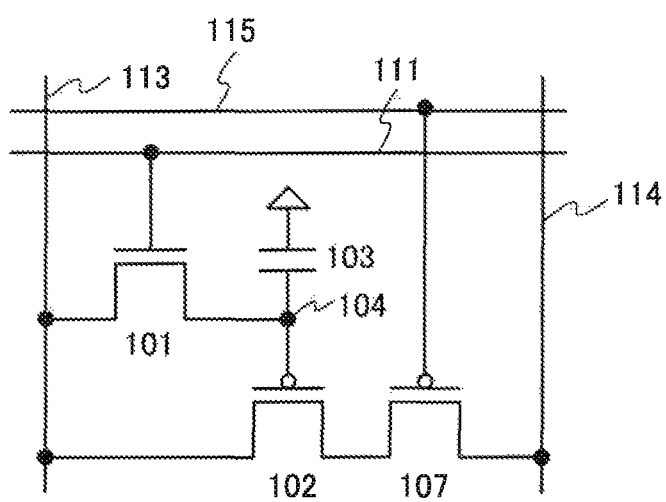

Note that as in a semiconductor device 135, the transistor 107 may be provided between the transistor 102 and the wiring 114 (FIG. 13B). In the semiconductor device 135, the one of the source and the drain of the transistor 107 is electrically connected to the wiring 114, and the other of the source and the drain of the transistor 107 is electrically connected to the one of the source and the drain of the transistor 102.

The other of the source and the drain of the transistor 102 is electrically connected to the wiring 113. The other of the source and the drain of the transistor 102 is electrically connected to the one of the source and the drain of the transistor 101.

Operation of writing data to the semiconductor device 130 and operation of reading data from the semiconductor device 130 will be described.

(Write Operation)

Figure 14:
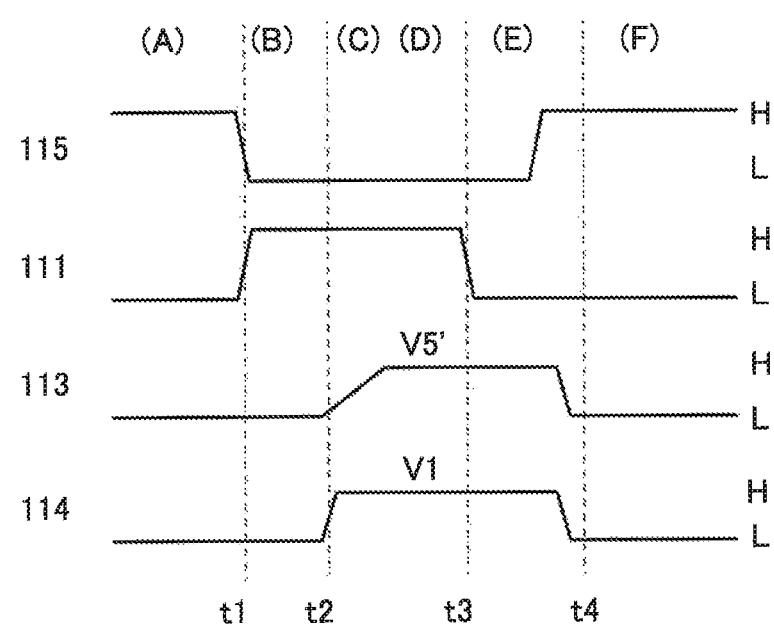
FIG. 14 is a timing diagram.

First, one example of the write operation is described. FIG. 14 is a timing diagram.

FIGS. 15A to 15E illustrate operation of the semiconductor device 130. As one example, a voltage to be read is referred to as V1, and operation of writing data by changing the potential of a node 104 (the gate potential of the transistor 102) to V5 is described. Since various voltages need to be applied in storing multi-bit data, it is advantageous in that V1 can be set freely.

Operation of writing data is performed by a first step and a second step. In the first step, a low voltage is applied to the wirings 113 and 114, a high voltage is applied to the wiring 111 to turn on the transistor 101 and thereby turning on the transistor 102, and a low voltage is applied to the wiring 115 to turn on the transistor 107. In the second step, the voltage V1 is applied to the wiring 114, and the application of the low voltage to the wiring 113 is stopped.

Owing to the second step, the potential V5 corresponding to data (the voltage V1) is applied to the node 104 from the wiring 114 through the source and the drain of the transistor 102, the source and the drain of the transistor 107, the wiring 113, and the source and the drain of the transistor 101. Then, the potential V5 is applied to the gate of the transistor 102. Electric charge corresponding to V5 is accumulated in the capacitor 103.

Figure 15A:
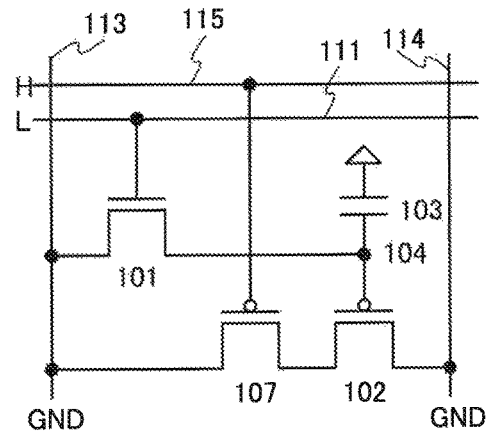
FIGS. 15A to 15E show operation of a semiconductor device.

FIG. 15A shows an initial state of the semiconductor device 130. In FIG. 14, the initial state is shown by (A).

A signal at a low voltage is input to the wiring 111, and thus, the transistor 101 is off.

A signal at a high voltage is input to the wiring 115, and thus, the transistor 107 is off.

A low voltage such as a reference potential is applied to the other electrode of the capacitor 103. A voltage corresponding to the capacitance value of the capacitor 103 is applied to the node 104.

A low voltage (GND) is applied to the wirings 113 and 114. Accordingly, the low voltage can be precharged to the wirings 113 and 114. The low voltage is the reference voltage (GND) here but may be a power supply voltage (VSS) or another voltage.

Figure 15B:
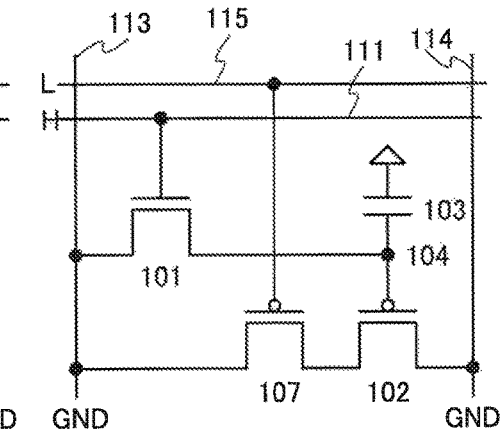

FIG. 15B shows a writing preparation state. In FIG. 14, the state is shown by (B).

In time t1, a signal at a high voltage is input to the wiring 111, and thus, the transistor 101 is turned on.

The transistor 101 is turned on, so that the wiring 113 and the node 104 are electrically connected. The potential of the wiring 113 is applied to the node 104, which results in turning on the transistor 102.

In the time t1, a signal at a low voltage is input to the wiring 115. The transistor 107 is turned on. The low voltage is a voltage at which the transistor 107 is turned on. The low voltage may be a reference voltage (GND), the power supply voltage (VSS), or another voltage.

A low voltage is applied to the wirings 113 and 114, and the transistors 101, 102, and 107 are turned on. The first step is completed.

Figure 15C:
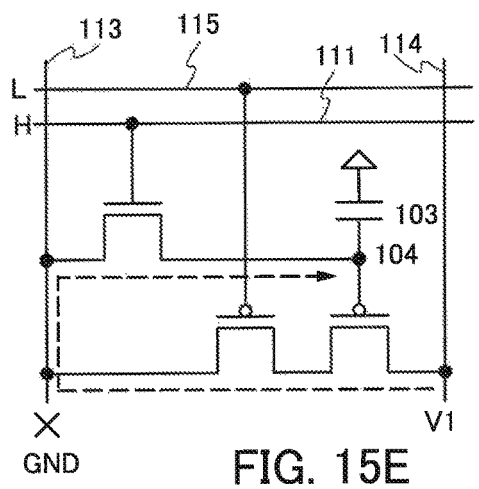
Figure 15D:
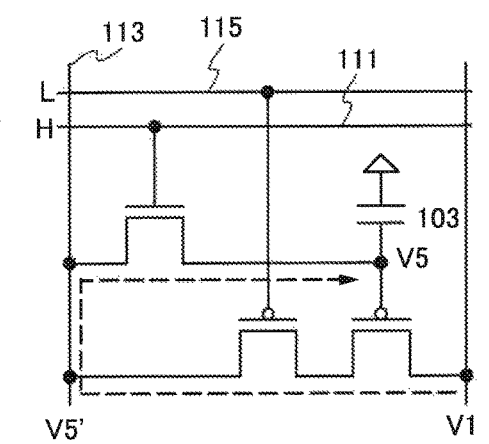

FIGS. 15C and 15D show a write state. In FIG. 14, the state is shown by (C) and (D).

In time t2, the voltage V1 is applied to the wiring 114 (FIG. 15C). The voltage V1 is a voltage to be read by a read operation. The level of V1 can be set freely depending on data to be written.

In the time t2, supply of the low voltage (GND) to the wiring 113 is stopped (FIG. 15C). At this time, the wiring 113 is electrically in a floating state from the precharged voltage. That is, the potential of the wiring 113 is easily changed by charge or discharge of electric charge. This floating state can be obtained by turning off the switch for supplying the potential of the wiring 113.

Since the transistors 107 and 102 are on, the wiring 113 is electrically connected to the wiring 114. The voltage of the wiring 113 is changed from the precharged low voltage (GND) to V5' (FIG. 15D). Note that the difference between V5' and V1 is about the threshold voltages of the transistors 102 and 107 (V1>V5').

Since the transistor 101 is on, data is written to the node 104 (the gate of the transistor 102) from the wiring 114 through the source and the drain of the transistor 102, the source and the drain of the transistor 107, the wiring 113, and the source and the drain of the transistor 101. Electric charge is accumulated in the capacitor 103. The potential of the node 104 is changed to V5.

The potential of the node 104 is changed to V5, and accordingly, a potential difference between the gate of the transistor 102 and the source of the transistor 102 becomes small; as a result, current (Id) flowing between the source and the drain of the transistor 102 becomes low. The transistor 102 is lastly turned off.

In the semiconductor device 130, V1, V5', and V5 are applied to the wiring 114, the wiring 113, and the node 104, respectively.

The voltage V1 is applied to the wiring 114 and the application of the low voltage to the wiring 113 is stopped, so that the second step is completed.

Through the above steps, the voltage V1 to be read is applied to the wiring 114 and the potential of the node 104 is changed to V5, so that the write operation is completed.

Figure 15E:
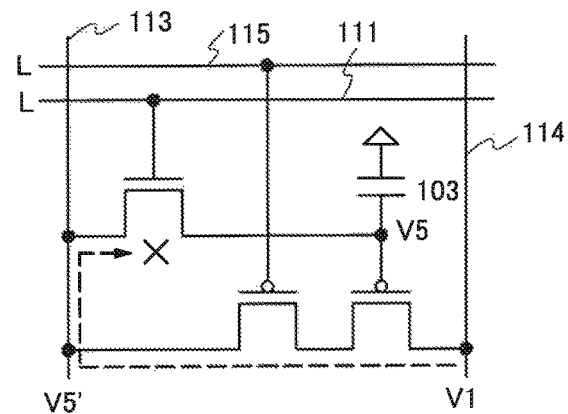

FIG. 15E shows a state after the write operation and before data retention. In FIG. 14, the state is shown by (E).

In time t3, a signal at a low voltage is input to the wiring 111. The transistor 101 is turned off. The node 104 and the wiring 113 are electrically disconnected. The transistor 101 has a characteristic of extremely low off-state current, and therefore, the potential (V5) of the node 104 is retained.

By time t4, the high voltage starts to be applied to the wiring 115, and the low voltage (GND) starts to be applied to the wirings 113 and 114.

The high voltage is applied to the wiring 115, so that the transistor 107 is turned off. The high voltage may be a potential at which the transistor 107 is turned off.

In the time t4, the state becomes the retention state. In FIG. 14, the state is shown by (F). The state of the semiconductor device 130 is the same as the state of the semiconductor device 130 in FIG. 15A except for the potential of the nodes 104 (V5). The transistors 101 and 107 are off.

Note that a low voltage is applied to the wiring 114 in (A) and (F) in FIG. 14, but a high voltage may be applied to the wiring 114 in (A) and (F) in FIG. 14. If a high voltage is applied to the wiring 114, when the state is changed from the state (E) to the state (F), i.e., when a high voltage is applied to the wiring 114, the voltage can be quickly changed in some cases.

(Read Operation)

Figure 16:
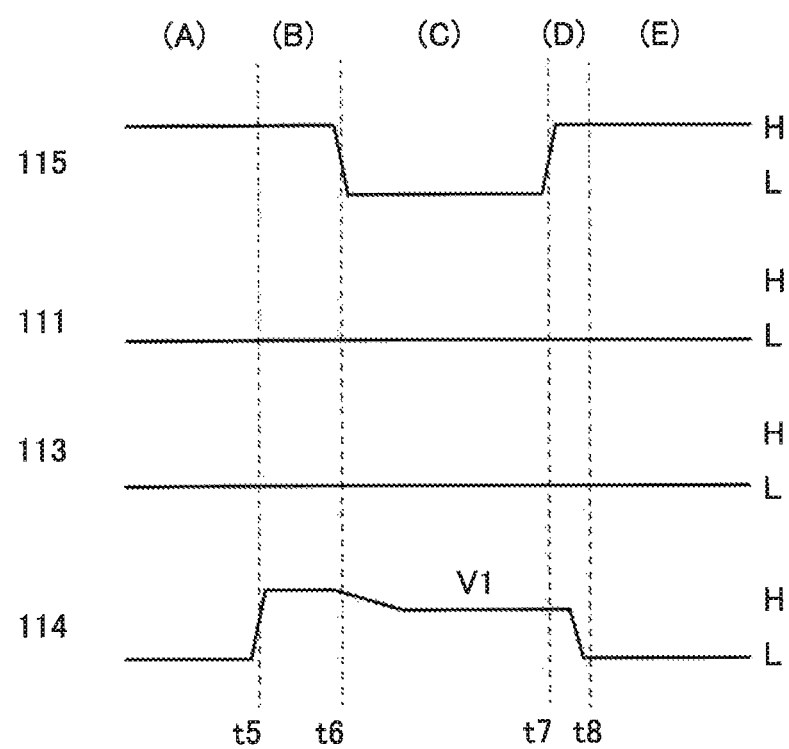
FIG. 16 is a timing diagram.

Next, one example of operation for reading the voltage V1 on the basis of electric charge written through the write operation is described. FIG. 16 is a timing diagram. FIGS. 17A to 17D show operation of the semiconductor device 130.

Operation for reading data is performed by a third step in which a high voltage is applied to the wiring 114 and a fourth step in which the application of the high voltage to the wiring 114 is stopped and a low voltage is applied to the wiring 115 to turn on the transistor 107. By the fourth step, the voltage of the wiring 114 is changed from the high voltage to the voltage V1.

Figure 17A:
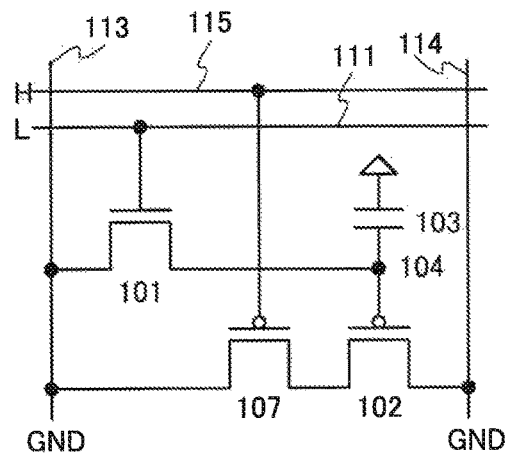
FIGS. 17A to 17D show operation of a semiconductor device.

FIG. 17A shows a retention state of the semiconductor device 130. In FIG. 16, the retention state is shown by (A).

Figure 17B:
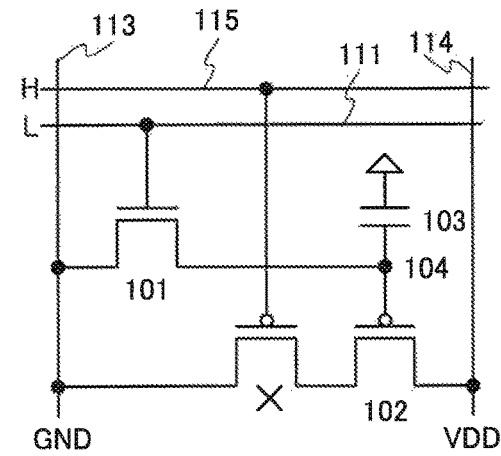

FIG. 17B shows a reading preparation state. In FIG. 16, the state is shown by (B).

In the time t5, a high voltage (VDD) is applied to the wiring 114. The high voltage can be precharged to the wiring 114.

Note that the transistors 101 and 107 remain off from the retention state.

The high voltage is applied to the wiring 114, so that the third step is completed.

Figure 17C:
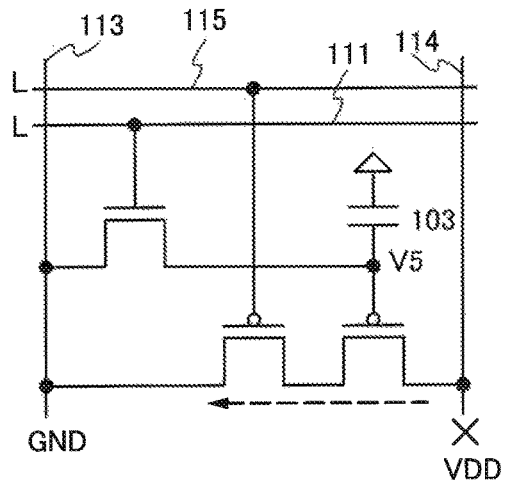
Figure 17D:
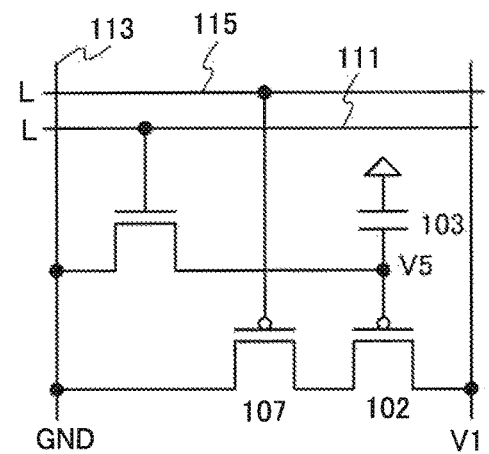

FIGS. 17C and 17D show a read state. In FIG. 16, the state is shown by (C).

In time t6, supply of the high voltage (VDD) to the wiring 114 is stopped (FIG. 17C). At this time, the wiring 114 is electrically in a floating state from the precharged voltage. That is, the potential of the wiring 114 is easily changed by charge and discharge of electric charge. This floating state can be obtained by turning off the switch for supplying the potential of the wiring 114.

In the time t6, a signal at a low voltage is input to the wiring 115. The transistor 107 is turned on.

The voltage V5 is applied to the gate of the transistor 102. The transistor 102 is turned on. The potential of the wiring 114 changes from the precharged high voltage (VDD) to V1 in response to the gate voltage V5 (FIG. 17D). A potential difference between the gate and the source of the transistor 102 becomes smaller over time, and consequently, the transistor 102 is turned off.

The wiring 114 is electrically connected to a discrimination circuit or the like to read V1. Accordingly, the voltage V1 can be read.

Application of the high voltage to the wiring 114 is stopped and the transistor 107 is turned on. Accordingly, the fourth step is completed.

After data is read, in time t7, a signal at a high voltage is input to the wiring 115. Accordingly, the transistor 107 is turned off ((D) in FIG. 16).

A low voltage (GND) is applied to the wiring 114 by time t8 ((D) in FIG. 16).

At the time t8, the state is the retention state. In FIG. 16, the state is shown by (E). The semiconductor device 130 is in the state shown in FIG. 17A.

Note that a low voltage is applied to the wiring 114 in (A) and (E) in FIG. 16, but a high voltage may be applied to the wiring 114 in (A) and (E) in FIG. 16. If a high voltage is applied to the wiring 114, when the state is changed from the state (A) to the state (B), i.e., when VDD is applied to the wiring 114, the voltage can be quickly changed.

Note that in the case where the potential of the node 104, that is, the voltage applied to the gate of the transistor 102 is reset, for example, a signal at a high voltage is input to the wiring 111. Accordingly, the transistor 101 is turned on, so that the node 104 is electrically connected to the wiring 113. Since GND is applied to the wiring 113, the potential of the node 104 is reset.

In the semiconductor device 130, the potential (V1) applied to the wiring 114 in writing data serves as a reading potential.

The semiconductor device 130 can attain an effect in Embodiment 1, like the semiconductor device 100. Further, a capacitance of the wiring 115 electrically connected to the transistor 107 in the semiconductor device 130 can be smaller than a capacitance of the wiring 112 electrically connected to the capacitor 103 in the semiconductor 100; therefore, power consumption of the semiconductor device 130 can be smaller.

Operation of the semiconductor device 135 shown in FIG. 13B is the same as that of the semiconductor device 130; therefore, the description of the operation of the semiconductor device 130 is referred to.

This embodiment can be implemented in combination with any of the other embodiments in this specification as appropriate.

Embodiment 4

Figure 18:
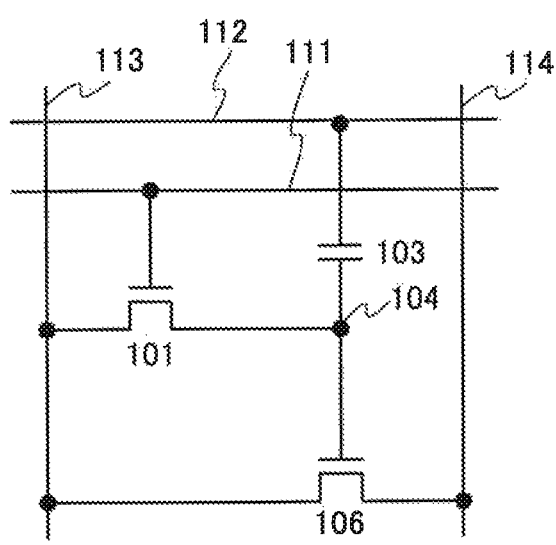
FIG. 18 is a circuit diagram of a semiconductor device.

FIG. 18 illustrates a semiconductor device 140. The semiconductor device 140 includes the transistor 101, a transistor 106, and the capacitor 103.

The semiconductor device 140 is different from the semiconductor device 100 (FIG. 1) in that the transistor 106 is an n-channel transistor.

A layer containing various materials such as an oxide semiconductor and silicon can be used for a region in which a channel of the transistor 106 is formed.

Connections of the transistor 102, the transistor 101, and the like to other elements are referred to as connections of the transistor 106, the transistor 101, and the like to other elements.

Operation of writing data to the semiconductor device 140 and operation of reading data from the semiconductor device 140 will be described.

(Write Operation)

Figure 19:
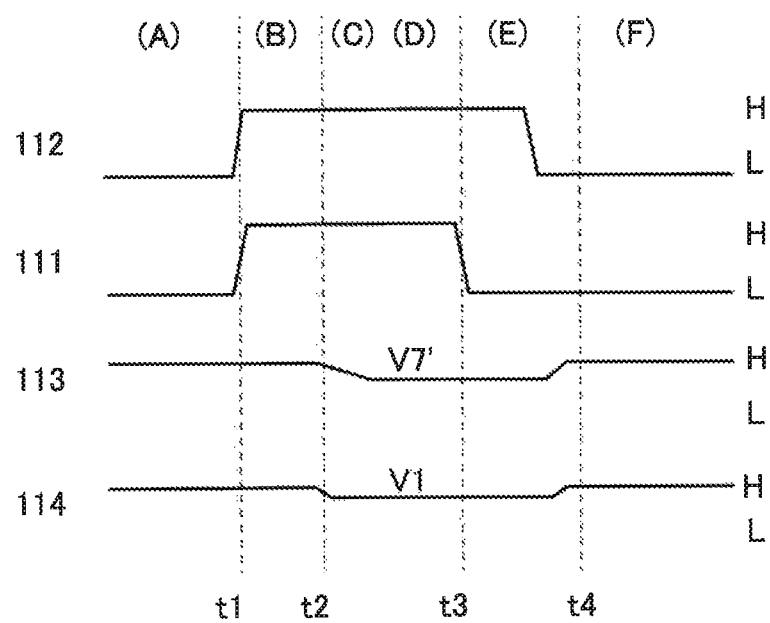
FIG. 19 is a timing diagram.

First, one example of the write operation is described. FIG. 19 is a timing diagram. FIGS. 20A to 20E illustrate operation of the semiconductor device 140. As one example, a voltage to be read is referred to as V1, and operation of writing data by changing the potential of a node 104 (the gate potential of the transistor 106) to V7 is described. Since various voltages need to be applied in storing multi-bit data, it is advantageous in that V1 can be set freely.

Operation of writing data is performed by a first step and a second step. In the first step, a high voltage is applied to the wirings 113 and 114, a high voltage is applied to the wiring 111 to turn on the transistor 101, and a high voltage is applied to the wiring 112 to turn on the transistor 106. In the second step, the voltage V1 is applied to the wiring 114, and the application of the high voltage to the wiring 113 is stopped.

Owing to the second step, a potential V7 corresponding to data (the voltage V1) is applied to the node 104 from the wiring 114 through the source and the drain of the transistor 106, the wiring 113, and the source and the drain of the transistor 101. Then, the potential V7 is applied to the gate of the transistor 106. Electric charge corresponding to V7 is accumulated in the capacitor 103.

Figure 20A:
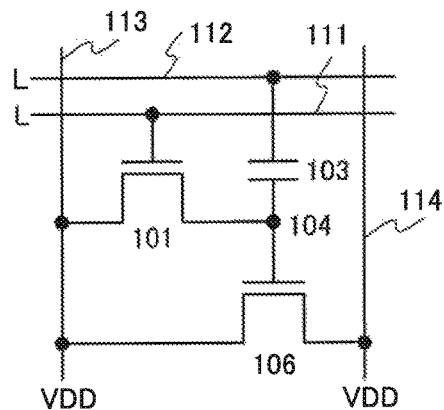
FIGS. 20A to 20E show operation of a semiconductor device.

FIG. 20A shows an initial state of the semiconductor device 140. In FIG. 19, the initial state is shown by (A).

A signal at a low voltage is input to the wiring 111, and thus, the transistor 101 is off.

A signal at a low voltage is input to the wiring 112. A voltage corresponding to the capacitance value of the capacitor 103 is applied to the node 104.

A high voltage (VDD) is applied to the wirings 113 and 114. Accordingly, the high voltage can be precharged to the wirings 113 and 114. The high voltage is the power supply voltage (VDD) here but may be another voltage.

Figure 20B:
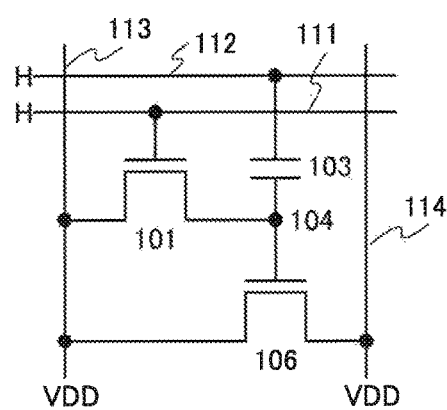

FIG. 20B shows a writing preparation state. In FIG. 19, the state is shown by (B).

In time t1, a signal at a high voltage is input to the wiring 111, and thus, the transistor 101 is turned on.

The transistor 101 is turned on, so that the wiring 113 and the node 104 are electrically connected. The potential of the node 104 is increased to be the high voltage (VDD).

In the time t1, a signal at a high voltage is input to the wiring 112. A voltage corresponding to the capacitance value of the capacitor 103 is applied to the node 104. The transistor 101 is turned on and a high voltage is applied to the wiring 112, so that the transistor 106 is turned on. The high voltage is a voltage at which the transistor 106 is turned on. The high voltage may be the power supply voltage (VDD) or another voltage.

A high voltage is applied to the wirings 113 and 114, so that the transistors 101 and 106 are turned on. The first step is completed.

Figure 20C:
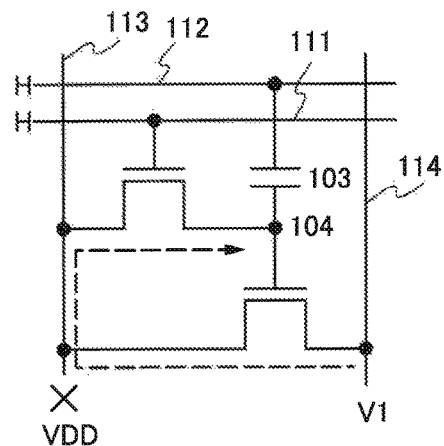
Figure 20D:
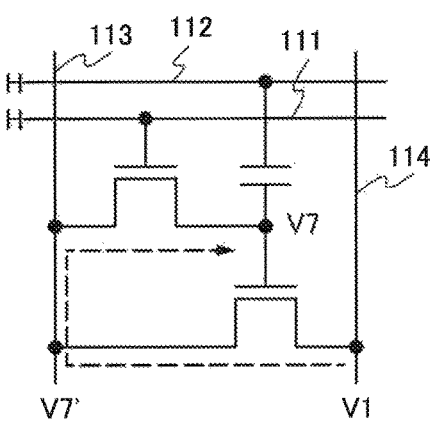

FIGS. 20C and 20D show a write state. In FIG. 19, the state is shown by (C) and (D).

In time t2, the voltage V1 is applied to the wiring 114 (FIG. 20C). The voltage V1 is a voltage to be read by a read operation. The level of V1 can be set freely depending on data to be written.

In the time t2, supply of the high voltage (VDD) to the wiring 113 is stopped (FIG. 20C). At this time, the wiring 113 is electrically in a floating state from the precharged voltage. That is, the potential of the wiring 113 is easily changed by charge or discharge of electric charge. This floating state can be obtained by turning off the switch for supplying the potential of the wiring 113.

Since the transistor 106 is on, the wiring 113 is electrically connected to the wiring 114. The voltage of the wiring 113 is changed from the precharged high voltage (VDD) to V7' (FIG. 20D). Note that the difference between V7' and V1 is about the threshold voltage of the transistor 106.

Since the transistor 101 is on, data is written to the node 104 (the gate of the transistor 106) from the wiring 114 through the source and the drain of the transistor 106, the wiring 113, and the source and the drain of the transistor 101. Electric charge is accumulated in the capacitor 103. The potential of the node 104 is changed to V7.

The potential of the node 104 is changed to V7, and accordingly, a potential difference between the gate of the transistor 106 and the source of the transistor 106 becomes small; as a result, current (Id) flowing between the source and the drain of the transistor 106 becomes low. The transistor 106 is lastly turned off.

In the semiconductor device 140, V1, V7', and V7 are applied to the wiring 114, the wiring 113, and the node 104, respectively.

The voltage V1 is applied to the wiring 114 and the application of the high voltage to the wiring 113 is stopped, so that the second step is completed.

Through the above steps, the voltage V1 to be read is applied to the wiring 114 and the potential of the node 104 is changed to V7, so that the write operation is completed.

Figure 20E:
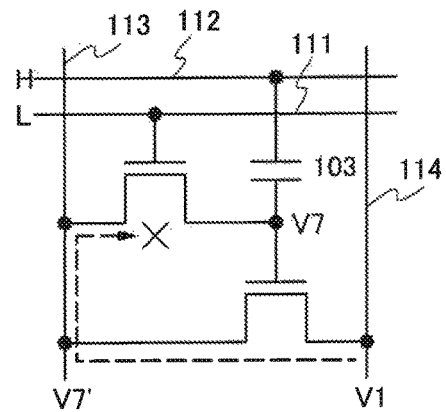

FIG. 20E shows a state after the write operation and before data retention. In FIG. 19, the state is shown by (E).

In time t3, a signal at a low voltage is input to the wiring 111. The transistor 101 is turned off. The node 104 and the wiring 113 are electrically disconnected. The transistor 101 has a characteristic of extremely low off-state current, and therefore, the potential (V7) of the node 104 is retained.

By time t4, the low voltage is applied to the wiring 112, and the high voltage (VDD) is applied to the wirings 113 and 114.

The low voltage is applied to the wiring 112, so that the potential of the node 104 is changed from V7 to a voltage at which the transistor 106 is turned off.

In the time t4, the state becomes the retention state. In FIG. 19, the state is shown by (F). The state of the semiconductor device 140 is the same as the state of the semiconductor device 140 in FIG. 20A except that the nodes 104 have different potentials. The transistor 101 is off.

Note that a high voltage is applied to the wiring 114 in (A) and (F) in FIG. 19, but a low voltage may be applied to the wiring 114 in (A) and (F) in FIG. 19. If a low voltage is applied to the wiring 114, when the state is changed from the state (E) to the state (F), i.e., when a low voltage is applied to the wiring 114, the voltage can be quickly changed in some cases.

(Read Operation)

Figure 21:
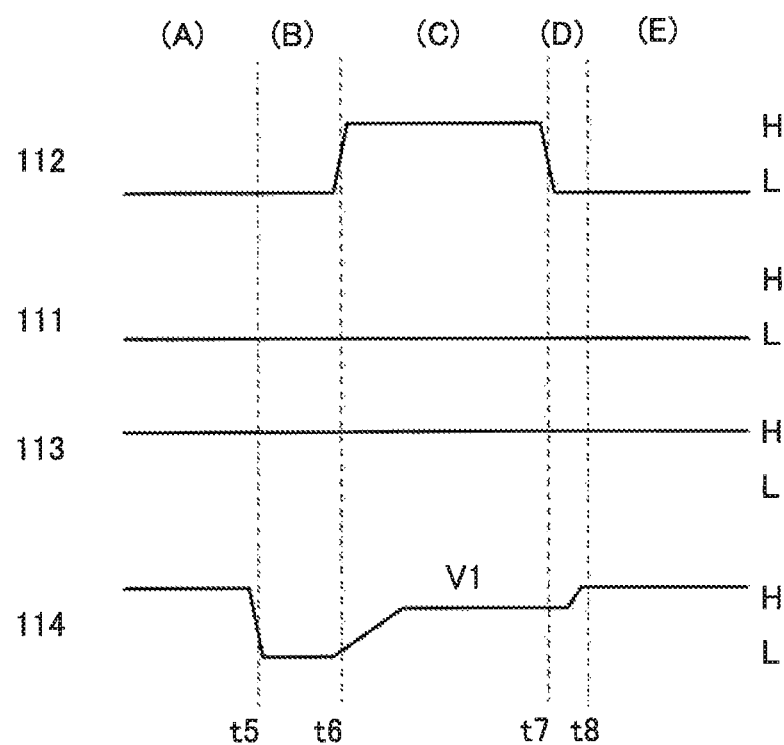
FIG. 21 is a timing diagram.

Next, one example of operation for reading the voltage V1 on the basis of electric charge written through the write operation is described. FIG. 21 is a timing diagram. FIGS. 22A to 22D show operation of the semiconductor device 140.

Operation for reading data is performed by a third step in which a low voltage is applied to the wiring 114 and a fourth step in which the application of the low voltage to the wiring 114 is stopped and a high voltage is applied to the wiring 112. By the fourth step, the voltage of the wiring 114 is changed from the low voltage to the voltage V1.

Figure 22A:
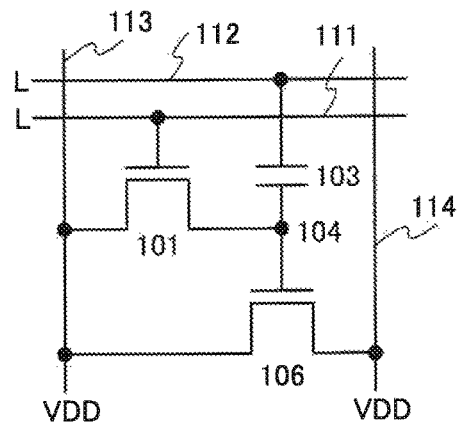
FIGS. 22A to 22D show operation of a semiconductor device.

FIG. 22A shows a retention state of the semiconductor device 140. In FIG. 21, the retention state is shown by (A).

Figure 22B:
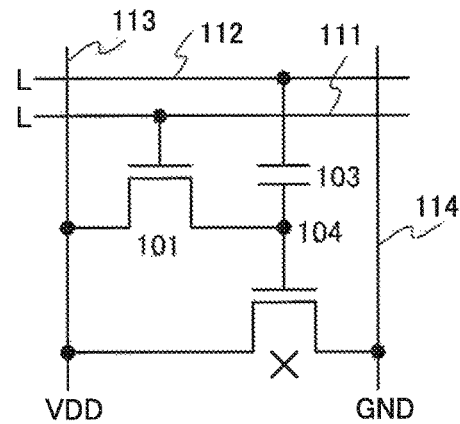

FIG. 22B shows a reading preparation state. In FIG. 21, the state is shown by (B).

In the time t5, a low voltage (GND) is applied to the wiring 114. The low voltage can be precharged to the wiring 114. Here, GND is applied to the wiring 114. However, the power supply voltage (VSS) or another voltage may be applied thereto.

Note that the transistors 101 and 106 remain off from the retention state.

The low voltage is applied to the wiring 114, so that the third step is completed.

Figure 22C:
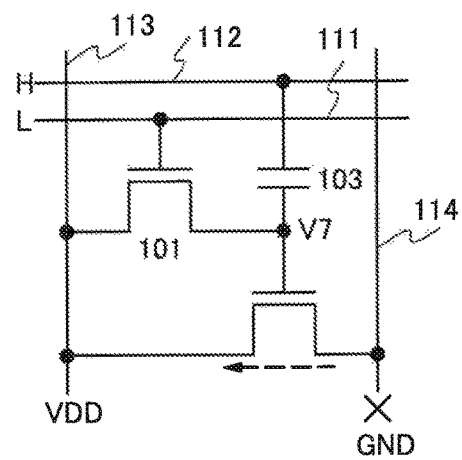
Figure 22D:
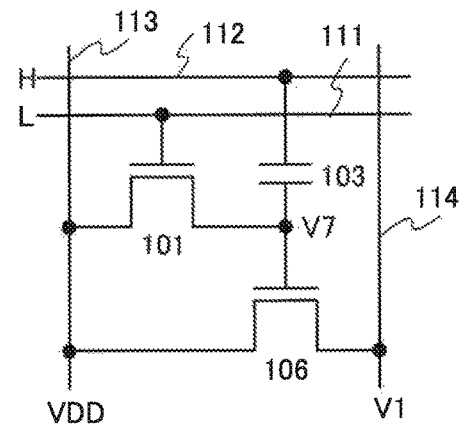

FIGS. 22C and 22D show a read state. In FIG. 21, the state is shown by (C).

In time t6, supply of the low voltage (GND) to the wiring 114 is stopped (FIG. 22C). At this time, the wiring 114 is electrically in a floating state from the precharged voltage. That is, the potential of the wiring 114 is easily changed by charge and discharge of electric charge. This floating state can be obtained by turning off the switch for supplying the potential of the wiring 114.

In the time t6, a signal at a high voltage is input to the wiring 112. The potential of the node 104 is changed to V7 in writing data. As a result, current (Id) corresponding to the gate potential of the transistor 106 (V7) and the potential of the wiring 114 flows. Note that the high voltage input to the wiring 112 is preferably equal to the high voltage input to the wiring 112 in the write operation.

The potential of the wiring 114 changes from the precharged low voltage (GND) to V1 in response to the gate voltage V7 (FIG. 22D). A potential difference between the gate and the source of the transistor 106 becomes smaller over time, and consequently, the transistor 106 is turned off.

The wiring 114 is electrically connected to a discrimination circuit or the like to read V1. Accordingly, the voltage V1 can be read.

Application of the low voltage to the wiring 114 is stopped and the high voltage is applied to the wiring 112. Accordingly, the fourth step is completed.

After data is read, in time t7, a signal at a low voltage is input to the wiring 112. The low voltage is applied to the wiring 112, so that the potential of the node 104 is changed from V7 by the low voltage. Accordingly, the transistor 106 is turned off.

A high voltage (VDD) is applied to the wiring 114 by time t8.

At the time t8, the state is the retention state. In FIG. 21, the state is shown by (E). The semiconductor device 140 is in the state shown in FIG. 22A.

Note that a high voltage is applied to the wiring 114 in (A) and (E) in FIG. 21, but a low voltage may be applied to the wiring 114 in (A) and (E) in FIG. 21. If a low voltage is applied to the wiring 114, when the state is changed from the state (A) to the state (B), i.e., when GND is applied to the wiring 114, the voltage can be quickly changed.

Note that in the case where the potential of the node 104, that is, the potential applied to the gate of the transistor 106 is reset, for example, the high voltage is applied to the wiring 112, the low voltage such as GND is applied to the wiring 113, and a signal at a high voltage is input to the wiring 111. Accordingly, the transistor 101 is turned on, so that the node 104 is electrically connected to the wiring 113. Since GND is applied to the wiring 113, the potential of the node 104 is reset.

In the semiconductor device 140, the potential (V1) applied to the wiring 114 in writing data serves as a reading potential.

The semiconductor device 140 can attain an effect in Embodiment 1, like the semiconductor device 100.

This embodiment can be implemented in combination with any of the other embodiments in this specification as appropriate.

Embodiment 5

Figure 23A:
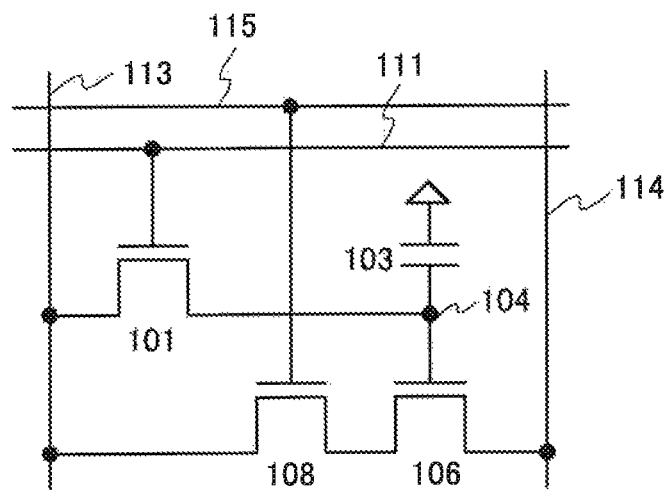
FIGS. 23A and 23B are circuit diagrams of a semiconductor device.

FIG. 23A illustrates a semiconductor device 150. The semiconductor device 150 includes the transistor 101, the transistor 106, the capacitor 103, and a transistor 108.

The semiconductor device 150 is different from the semiconductor device 100 (FIG. 1) in that the transistor 106 is included instead of the transistor 102. The semiconductor device 150 includes the transistor 108 and a reference potential (GND) from a reference potential terminal is applied to the other electrode of the capacitor 103. Note that a power supply potential (VSS) from a power supply potential terminal or another potential, which is not the reference potential, may be applied to the other electrode of the capacitor 103.

The transistor 106 provided instead of the transistor 102 is an n-channel transistor. A layer containing various materials such as an oxide semiconductor and silicon can be used for a region in which a channel of the transistor 106 is formed.

Connections of the transistor 102, the transistor 101, and the like to other elements are referred to as connections of the transistor 106, the transistor 101, and the like to other elements.

The transistor 108 is an n-channel transistor. A layer containing various materials such as an oxide semiconductor and silicon can be used for a region in which a channel of the transistor 108 is formed.

A gate of the transistor 108 is electrically connected to a wiring 115. The wiring 115 can function as a word line.

One of a source and a drain of the transistor 108 is electrically connected to the other of the source and the drain of the transistor 106.

The other of the source and the drain of the transistor 108 is electrically connected to the wiring 113. The other of the source and the drain of the transistor 108 is electrically connected to the one of the source and the drain of the transistor 101.

Figure 23B:
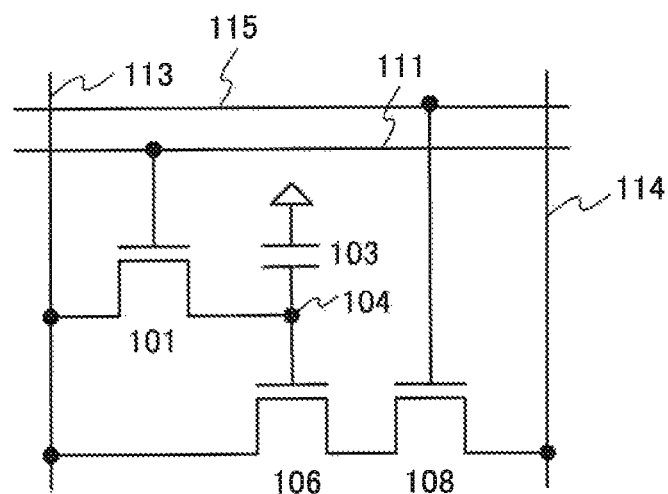

Note that as in a semiconductor device 155, the transistor 108 may be provided between the transistor 106 and the wiring 114 (FIG. 23B). In the semiconductor device 155, the one of the source and the drain of the transistor 108 is electrically connected to the wiring 114, and the other of the source and the drain of the transistor 108 is electrically connected to the one of the source and the drain of the transistor 106.

The other of the source and the drain of the transistor 106 is electrically connected to the wiring 113. The other of the source and the drain of the transistor 106 is electrically connected to the one of the source and the drain of the transistor 101.

Operation of writing data to the semiconductor device 150 and operation of reading data from the semiconductor device 150 will be described.

(Write Operation)

Figure 24:
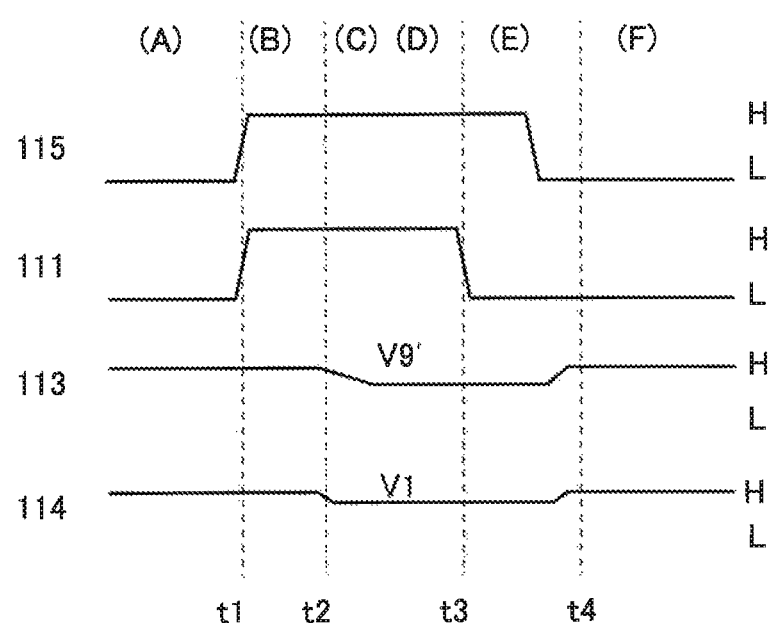
FIG. 24 is a timing diagram.

First, one example of the write operation is described. FIG. 24 is a timing diagram. FIGS. 25A to 25E illustrate operation of the semiconductor device 150. As one example, a voltage to be read is referred to as V1, and operation of writing data by changing the potential of a node 104 (the gate potential of the transistor 106) to V9 is described. Since various voltages need to be applied in storing multi-bit data, it is advantageous in that V1 can be set freely.

Operation of writing data is performed by a first step and a second step. In the first step, a high voltage is applied to the wirings 113 and 114, a high voltage is applied to the wiring 111 to turn on the transistor 101 and thereby turning on the transistor 106, and a low voltage is applied to the wiring 115 to turn on the transistor 108. In the second step, the voltage V1 is applied to the wiring 114, and the application of the high voltage to the wiring 113 is stopped.

Owing to the second step, the potential V9 corresponding to data (the voltage V1) is applied to the node 104 from the wiring 114 through the source and the drain of the transistor 106, the source and the drain of the transistor 108, the wiring 113, and the source and the drain of the transistor 101. Then, the potential V9 is applied to the gate of the transistor 106. Electric charge corresponding to V9 is accumulated in the capacitor 103.

Figure 25A:
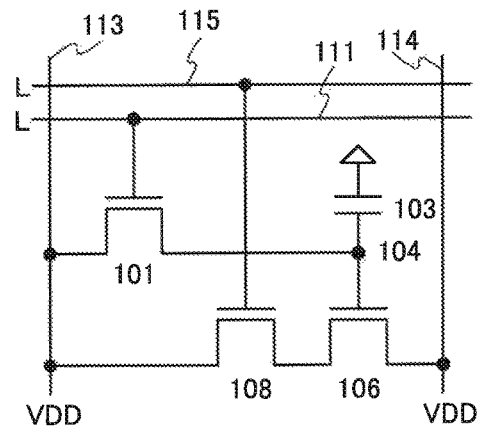
FIGS. 25A to 25E show operation of a semiconductor device.

FIG. 25A shows an initial state of the semiconductor device 150. In FIG. 24, the initial state is shown by (A).

A signal at a low voltage is input to the wiring 111, and thus, the transistor 101 is off.

A signal at a low voltage is input to the wiring 115, and thus, the transistor 108 is off. The low voltage is a voltage at which the transistor 108 is turned off. The low voltage may be the reference voltage (GND), the power supply voltage (VSS) or another voltage.

A low voltage such as a reference potential is applied to the other electrode of the capacitor 103. A voltage corresponding to the capacitance value of the capacitor 103 is applied to the node 104.

A high voltage (VDD) is applied to the wirings 113 and 114. Accordingly, the high voltage can be precharged to the wirings 113 and 114. The high voltage is the power supply voltage (VDD) here but may be another voltage.

Figure 25B:
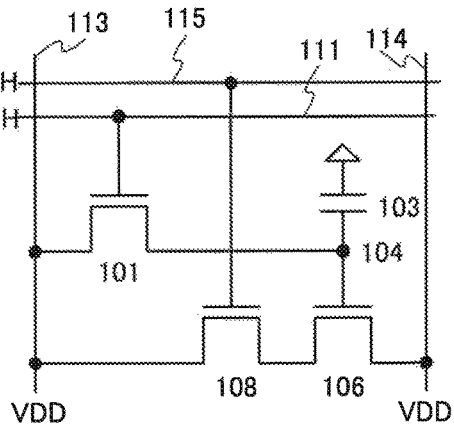

FIG. 25B shows a writing preparation state. In FIG. 24, the state is shown by (B).

In time t1, a signal at a high voltage is input to the wiring 111, and thus, the transistor 101 is turned on.

The transistor 101 is turned on, so that the wiring 113 and the node 104 are electrically connected. The potential of the wiring 113 is applied to the node 104, which results in turning on the transistor 106.

In the time t1, a signal at a high voltage is input to the wiring 115. The transistor 108 is turned on. The high voltage is a voltage at which the transistor 108 is turned on. The high voltage may be the power supply voltage (VDD) or another voltage.

A high voltage is applied to the wirings 113 and 114, and the transistors 101, 106, and 108 are turned on. The first step is completed.

Figure 25C:
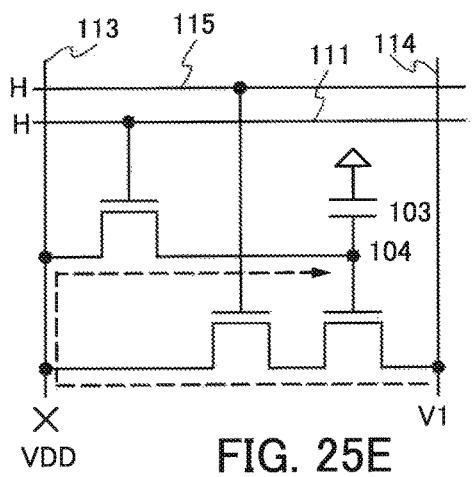
Figure 25D:
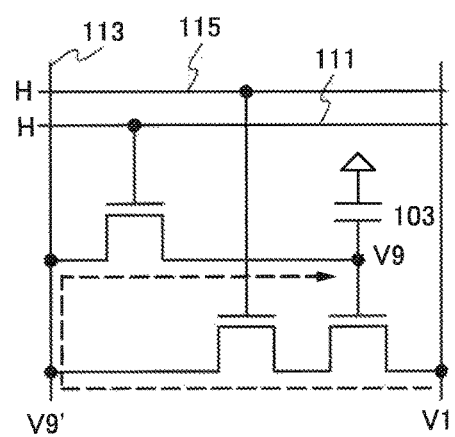

FIGS. 25C and 25D show a write state. In FIG. 24, the state is shown by (C) and (D).

In time t2, the voltage V1 is applied to the wiring 114 (FIG. 25C). The voltage V1 is a voltage to be read by a read operation. The level of V1 can be set freely depending on data to be written.

In the time t2, supply of the high voltage (VDD) to the wiring 113 is stopped (FIG. 25C). At this time, the wiring 113 is electrically in a floating state from the precharged voltage. That is, the potential of the wiring 113 is easily changed by charge or discharge of electric charge. This floating state can be obtained by turning off the switch for supplying the potential of the wiring 113.

Since the transistors 108 and 106 are on, the wiring 113 is electrically connected to the wiring 114. The voltage of the wiring 113 is changed from the precharged high voltage (VDD) to V9' (FIG. 25D). Note that the difference between V9' and V1 is about the threshold voltages of the transistors 106 and 108.

Since the transistor 101 is on, data is written to the node 104 (the gate of the transistor 106) from the wiring 114 through the source and the drain of the transistor 101, the source and the drain of the transistor 108, the wiring 113, and the source and the drain of the transistor 101. Electric charge is accumulated in the capacitor 103. The potential of the node 104 is changed to V9.

The potential of the node 104 is changed to V9, and accordingly, a potential difference between the gate of the transistor 106 and the source of the transistor 106 becomes small; as a result, current (Id) flowing between the source and the drain of the transistor 106 becomes low. The transistor 106 is lastly turned off.

In the semiconductor device 150, V1, V9', and V9 are applied to the wiring 114, the wiring 113, and the node 104, respectively.

The voltage V1 is applied to the wiring 114 and the application of the high voltage to the wiring 113 is stopped, so that the second step is completed.

Through the above steps, the voltage V1 to be read is applied to the wiring 114 and the potential of the node 104 is changed to V9, so that the write operation is completed.

Figure 25E:
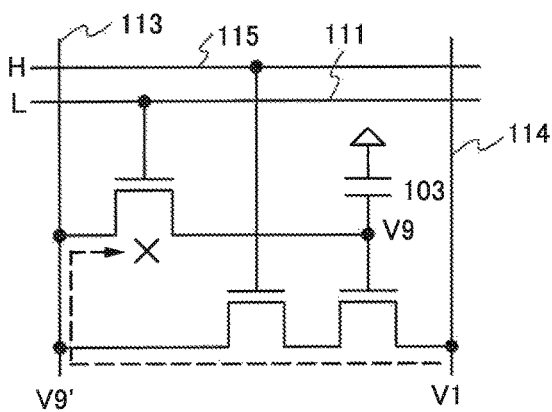

FIG. 25E shows a state after the write operation and before data retention. In FIG. 24, the state is shown by (E).

In time t3, a signal at a low voltage is input to the wiring 111. The transistor 101 is turned off. The node 104 and the wiring 113 are electrically disconnected. The transistor 101 has a characteristic of extremely low off-state current, and therefore, the potential (V9) of the node 104 is retained.

By time t4, the low voltage starts to be applied to the wiring 115, and the high voltage (VDD) starts to be applied to the wirings 113 and 114.

The low voltage is applied to the wiring 115, so that the transistor 108 is turned off. The low voltage may be a potential at which the transistor 108 is turned off.

In the time t4, the state becomes the retention state. In FIG. 24, the state is shown by (F). The state of the semiconductor device 150 is the same as the state of the semiconductor device 150 in FIG. 25A except for the potential of the nodes 104 (V9). The transistors 101 and 108 are off.

Note that a high voltage is applied to the wiring 114 in (A) and (F) in FIG. 24, but a low voltage may be applied to the wiring 114 in (A) and (F) in FIG. 24. If a low voltage is applied to the wiring 114, when the state is changed from the state (E) to the state (F), i.e., when a low voltage is applied to the wiring 114, the voltage can be quickly changed in some cases.

(Read Operation)

Figure 26:
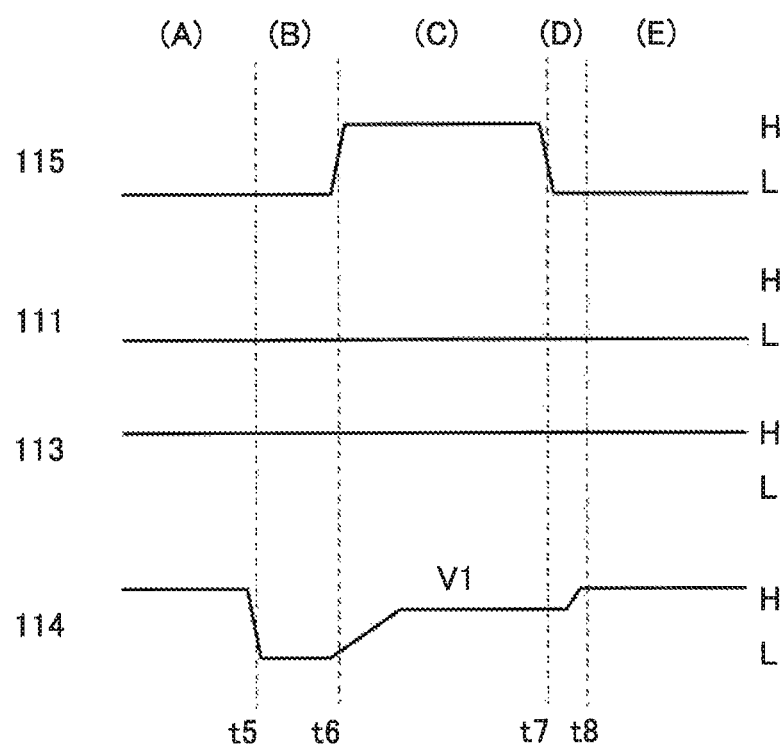
FIG. 26 is a timing diagram.

Next, one example of operation for reading the voltage V1 on the basis of electric charge written through the write operation is described. FIG. 26 is a timing diagram. FIGS. 27A to 27D show operation of the semiconductor device 150.

Operation for reading data is performed by a third step in which a low voltage is applied to the wiring 114 and a fourth step in which the application of the low voltage to the wiring 114 is stopped and a high voltage is applied to the wiring 115 to turn on the transistor 108. By the fourth step, the voltage of the wiring 114 is changed from the low voltage to the voltage V1.

Figure 27A:
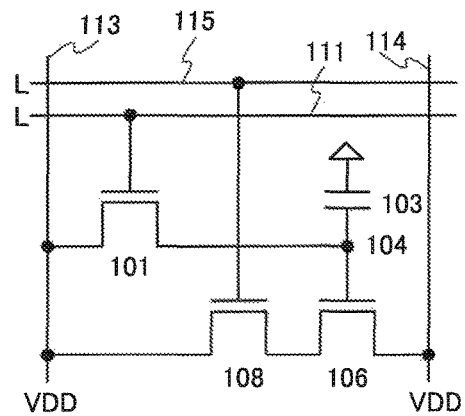
FIGS. 27A to 27D show operation of a semiconductor device.

FIG. 27A shows a retention state of the semiconductor device 150. In FIG. 26, the retention state is shown by (A).

Figure 27B:
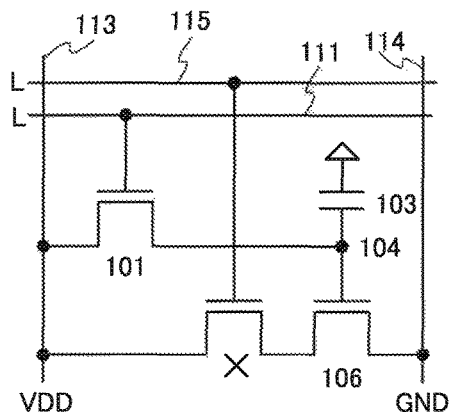

FIG. 27B shows a reading preparation state. In FIG. 26, the state is shown by (B).

In the time t5, a low voltage (GND) is applied to the wiring 114. The low voltage can be precharged to the wiring 114. Here, GND is applied to the wiring 114, but a power supply voltage (VSS) or another voltage may be applied thereto.

Note that the transistors 101 and 108 remain off from the retention state.

The low voltage is applied to the wiring 114, so that the third step is completed.

Figure 27C:
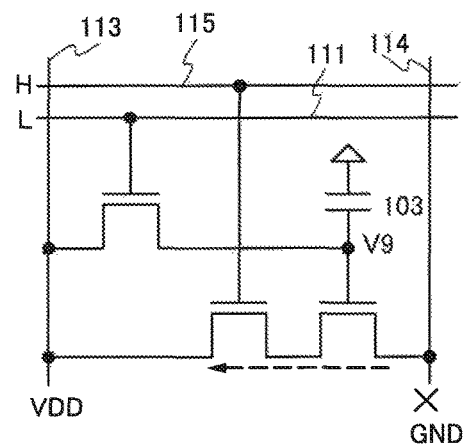
Figure 27D:
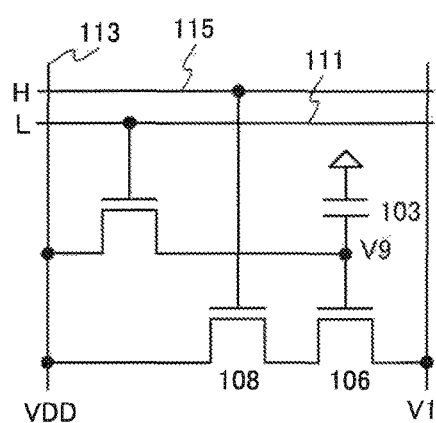

FIGS. 27C and 27D show a read state. In FIG. 26, the state is shown by (C).

In time t6, supply of the low voltage (GND) to the wiring 114 is stopped (FIG. 27C). At this time, the wiring 114 is electrically in a floating state from the precharged voltage. That is, the potential of the wiring 114 is easily changed by charge and discharge of electric charge. This floating state can be obtained by turning off the switch for supplying the potential of the wiring 114.

In the time t6, a signal at a high voltage is input to the wiring 115. The transistor 108 is turned on.

Since the voltage V9 is applied to the gate of the transistor 106, the transistor 106 is turned on. The potential of the wiring 114 changes from the precharged low voltage (GND) to V1 in response to the gate voltage V9 (FIG. 27D). A potential difference between the gate and the source of the transistor 106 becomes smaller over time, and consequently, the transistor 106 is turned off.

The wiring 114 is electrically connected to a discrimination circuit or the like to read V1. Accordingly, the voltage V1 can be read.

Application of the low voltage to the wiring 114 is stopped and the transistor 108 is turned on. Accordingly, the fourth step is completed.

After data is read, in time t7, a signal at a low voltage is input to the wiring 115. Accordingly, the transistor 108 is turned off ((D) in FIG. 26).

A high voltage (VDD) is applied to the wiring 114 by time t8 ((D) in FIG. 26).

At the time t8, the state is the retention state. In FIG. 26, the state is shown by (E). The semiconductor device 150 is in the state shown in FIG. 27A.

Note that a high voltage is applied to the wiring 114 in (A) and (E) in FIG. 26, but a low voltage may be applied to the wiring 114 in (A) and (E) in FIG. 26. If a low voltage is applied to the wiring 114, when the state is changed from the state (A) to the state (B), i.e., when GND is applied to the wiring 114, the voltage can be quickly changed.

Note that in the case where the potential of the node 104, that is, the voltage applied to the gate of the transistor 106 is reset, for example, a low voltage such as GND is applied to the wiring 113, and a signal at a high voltage is input to the wiring 111. Accordingly, the transistor 101 is turned on, so that the node 104 is electrically connected to the wiring 113. Since GND is applied to the wiring 113, the potential of the node 104 is reset.

In the semiconductor device 150, the potential (V1) applied to the wiring 114 in writing data serves as a reading potential.

The semiconductor device 150 can attain an effect in Embodiment 1, like the semiconductor device 100. Further, a capacitance of the wiring 115 electrically connected to the transistor 108 in the semiconductor device 150 can be smaller than a capacitance of the wiring 112 electrically connected to the capacitor 103 in the semiconductor 140; therefore, power consumption of the semiconductor device 150 can be smaller.

Operation of the semiconductor device 155 shown in FIG. 23B is the same as that of the semiconductor device 150; therefore, the description of the operation of the semiconductor device 150 is referred to.

This embodiment can be implemented in combination with any of the other embodiments in this specification as appropriate.

Embodiment 6

An oxide semiconductor that can be used for the channel of the transistor 101 in Embodiments 1 to 5 will be described.

An oxide semiconductor preferably contains at least indium (In) or zinc (Zn). The oxide semiconductor preferably contains, in addition to In and Zn, gallium (Ga) serving as a stabilizer that reduces variations in electric characteristics of the transistor using the above-described oxide. Tin (Sn) is preferably contained as a stabilizer. Hafnium (Hf) is preferably contained as a stabilizer. Aluminum (Al) is preferably contained as a stabilizer. Zirconium (Zr) is preferably contained as a stabilizer.

Among the oxide semiconductors, unlike silicon carbide, gallium nitride, or gallium oxide, an In—Ga—Zn-based oxide, an In—Sn—Zn-based oxide, or the like has an advantage of high mass productivity because a transistor with favorable electrical characteristics can be formed by sputtering or a wet process. Further, unlike silicon carbide, gallium nitride, or gallium oxide, with the use of the In—Ga—Zn-based oxide, a transistor with favorable electrical characteristics can be formed over a glass substrate. Further, a larger substrate can be used.

As another stabilizer, one or more kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, any of the following oxides can be used, for example: indium oxide, gallium oxide, tin oxide, zinc oxide, In—Zn-based oxide, Sn—Zn-based oxide, Al—Zn-based oxide, Zn—Mg-based oxide, Sn—Mg-based oxide, In—Mg-based oxide, In—Ga-based oxide, In—Ga—Zn-based oxide (also referred to as IGZO), In—Al—Zn-based oxide, In—Sn—Zn-based oxide, Sn—Ga—Zn-based oxide, Al—Ga—Zn-based oxide, Sn—Al—Zn-based oxide, In—Hf—n-based oxide, In—La—Zn-based oxide, In—Pr—Zn-based oxide, In—Nd—Zn-based oxide, In—Sm—Zn-based oxide, In—Eu—Zn-based oxide, In—Gd—Zn-based oxide, In—Tb—Zn-based oxide, In—Dy—Zn-based oxide, In—Ho—Zn-based oxide, In—Er—Zn-based oxide, In—Tm—Zn-based oxide, In—Yb—Zn-based oxide, In—Lu—Zn-based oxide, In—Sn—Ga—Zn-based oxide, In—Hf—Ga—Zn-based oxide, In—Al—Ga—Zn-based oxide, In—Sn—Al—Zn-based oxide, In—Sn—Hf—Zn-based oxide, and In—Hf—Al—Zn-based oxide.

Note that, for example, an In—Ga—Zn-based oxide means an oxide containing In, Ga, and Zn and there is no particular limitation on the ratio of In:Ga:Zn. Further, the In—Ga—Zn-based oxide may contain a metal element other than In, Ga, and Zn. The In—Ga—Zn-based oxide has sufficiently high resistance when no electric field is applied thereto, so that off-state current can be sufficiently reduced. Further, the In—Ga—Zn-based oxide has high mobility.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or an oxide with an atomic ratio close to any of the above atomic ratios can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), In:Sn:Zn=2:1:5 (=1/4:1/8:5/8), or an oxide with an atomic ratio close to any of the above atomic ratios can be used.

For example, with an In—Sn—Zn-based oxide, high mobility can be realized relatively easily. However, even with an In—Ga—Zn-based oxide, mobility can be increased by reducing the defect density in the bulk.

A structure of the oxide semiconductor film is described below.

An oxide semiconductor film is classified roughly into a single-crystal oxide semiconductor film and a non-single-crystal oxide semiconductor film. The non-single-crystal oxide semiconductor film includes any of an amorphous oxide semiconductor film, a microcrystalline oxide semiconductor film, a polycrystalline oxide semiconductor film, a c-axis aligned crystalline oxide semiconductor (CAAC-OS) film, and the like.

The amorphous oxide semiconductor film has disordered atomic arrangement and no crystalline component. A typical example thereof is an oxide semiconductor film in which no crystal part exists even in a microscopic region, and the whole of the film is amorphous.

The microcrystalline oxide semiconductor film includes a microcrystal (also referred to as nanocrystal) with a size greater than or equal to 1 nm and less than 10 nm, for example. Thus, the microcrystalline oxide semiconductor film has a higher degree of atomic order than the amorphous oxide semiconductor film. Hence, the density of defect states of the microcrystalline oxide semiconductor film is lower than that of the amorphous oxide semiconductor film.

The CAAC-OS film is one of oxide semiconductor films including a plurality of crystal parts, and most of the crystal parts each fit inside a cube whose one side is less than 100 nm. Thus, there is a case where a crystal part included in the CAAC-OS film fits inside a cube whose one side is less than 10 nm, less than 5 nm, or less than 3 nm. The density of defect states of the CAAC-OS film is lower than that of the microcrystalline oxide semiconductor film. The CAAC-OS film is described in detail below.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2 $\theta$) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2 $\theta$ is around 56°. This peak is derived from the (110) plane of the $InGaZnO_4$ crystal. Here, analysis (f scan) is performed under conditions where the sample is rotated around a normal vector of a sample surface as an axis (f axis) with 2 q fixed at around 56°. In the case where the sample is a single-crystal oxide semiconductor film of $InGaZnO_4$, six peaks appear. The six peaks are derived from crystal planes equivalent to the (110) plane. On the other hand, in the case of a CAAC-OS film, a peak is not clearly observed even when φ scan is performed with 2 $\theta$ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

Further, the degree of crystallinity in the CAAC-OS film is not necessarily uniform.

For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added is changed, and the degree of crystallinity in the CAAC-OS film varies depending on regions.

Note that when the CAAC-OS film with an $InGaZnO_4$ crystal is analyzed by an out-of-plane method, a peak of 2 $\theta$ may also be observed at around 36°, in addition to the peak of 2 $\theta$ at around 31°. The peak of 2 $\theta$ at around 36° indicates that a crystal having no c-axis alignment is included in part of the CAAC-OS film. It is preferable that in the CAAC-OS film, a peak of 2 $\theta$ appears at around 31° and a peak of 2 $\theta$ do not appear at around 36°.

With the use of the CAAC-OS film in a transistor, variation in electrical characteristics of the transistor due to irradiation with visible light or ultraviolet light is small. Thus, the transistor has high reliability.

Note that an oxide semiconductor film may be a stacked film including two or more kinds of an amorphous oxide semiconductor film, a microcrystalline oxide semiconductor film, and a CAAC-OS film, for example.

For example, the CAAC-OS film is formed by a sputtering method with a polycrystalline metal oxide sputtering target.

For the deposition of the CAAC-OS film, the following conditions are preferably used.

By reducing the amount of impurities entering the CAAC-OS layer during the deposition, the crystal state can be prevented from being broken by the impurities. For example, the concentration of impurities (e.g., hydrogen, water, carbon dioxide, and nitrogen) which exist in the treatment chamber may be reduced. Furthermore, the concentration of impurities in a deposition gas may be reduced. Specifically, a deposition gas whose dew point is −80° C. or lower, preferably −100° C. or lower is used.

By increasing the substrate heating temperature during the deposition, migration of a sputtered particle is likely to occur after the sputtered particle reaches a substrate surface. Specifically, the substrate heating temperature during the deposition is higher than or equal to 100° C. and lower than or equal to 740° C., preferably higher than or equal to 200° C. and lower than or equal to 500° C. By increasing the substrate heating temperature during the deposition, when the flat-plate-like sputtered particles reach the substrate, migration occurs on the substrate, so that a flat plane of each flat-plate-like sputtered particle is attached to the substrate.

Furthermore, it is preferable that the proportion of oxygen in the deposition gas be increased and the power be optimized in order to reduce plasma damage at the deposition. The proportion of oxygen in the deposition gas is higher than or equal to 30 vol %, preferably 100 vol %.

The oxide semiconductor layer is not limited to a single-layer metal oxide film and may have a stacked structure of a plurality of metal oxide films. In a semiconductor film in which first to third metal oxide films are sequentially stacked, for example, the first metal oxide film and the third metal oxide film are each an oxide film which contains at least one of the metal elements contained in the second metal oxide film and whose lowest conduction band energy is closer to the vacuum level than that of the second metal oxide film by higher than or equal to 0.05 eV, 0.07 eV, 0.1 eV, or 0.15 eV and lower than or equal to 2 eV, 1 eV, 0.5 eV, or 0.4 eV. Further, the second metal oxide film preferably contains at least indium in order to increase the carrier mobility.

In the transistor including the above oxide semiconductor film, when a voltage is applied to the gate electrode so that an electric field is applied to the semiconductor film, a channel region is formed in the second metal oxide film whose lowest conduction band energy is small in the semiconductor film. That is, since the third metal oxide film is provided between the second metal oxide film and the gate insulating film, a channel region can be formed in the second metal oxide film which is insulated from the gate insulating film.

Since the third metal oxide film contains at least one of the metal elements contained in the second metal oxide film, interface scattering is unlikely to occur at the interface between the second metal oxide film and the third metal oxide film. Thus, the movement of carriers is unlikely to be inhibited at the interface, which results in an increase in the field-effect mobility of the transistor.

Further, when an interface level is formed at the interface between the second metal oxide film and the first metal oxide film, a channel region is formed also in the vicinity of the interface, which causes a change in the threshold voltage of the transistor. However, since the first metal oxide film contains at least one of the metal elements contained in the second metal oxide film, an interface level is unlikely to be formed at the interface between the second metal oxide film and the first metal oxide film. Accordingly, the above structure allows reducing of variations in the electrical characteristics of the transistor, such as the threshold voltage.

Further, it is preferable that a plurality of metal oxide films be stacked so that an interface level due to an impurity existing between the metal oxide films, which inhibits carrier flow, is not formed at the interface between the metal oxide films. This is because when an impurity exists between the stacked metal oxide films, the continuity of the lowest conduction band energy between the metal oxide films is lost, and carriers are trapped or disappear by recombination in the vicinity of the interface. By reducing an impurity existing between the films, a continuous junction (here, in particular, a U-shape well structure whose lowest conduction band energy is changed continuously between the films) is formed more easily than the case of merely stacking a plurality of metal oxide films which share at least one main metal component.

In order to form such a continuous energy band, it is necessary to form films continuously without being exposed to air, with use of a multi-chamber deposition apparatus (sputtering apparatus) including a load lock chamber. Each chamber in the sputtering apparatus is preferably evacuated to high vacuum (about $5 \times 10^{-7}$ Pa to $1 \times 10^{-4}$ Pa) with an entrapment vacuum evacuation pump such as a cryopump so that water or the like, which is an impurity for an oxide semiconductor, is removed as much as possible. Alternatively, a turbo molecular pump and a cold trap are preferably used in combination to prevent backflow of gas into the chamber through an evacuation system.

To obtain a highly purified intrinsic oxide semiconductor, not only high vacuum evacuation of the chambers but also high purification of a gas used in the sputtering is important. When an oxygen gas or an argon gas used as the above gas has a dew point of $-40°$ C. or lower, preferably $-80°$ C. or lower, further preferably $-100°$ C. or lower and is highly purified, moisture and the like can be prevented from entering the oxide semiconductor film as much as possible.

The first metal oxide film or the third metal oxide film may be an oxide film containing aluminum, silicon, titanium, gallium, germanium, yttrium, zirconium, tin, lanthanum, cerium, or hafnium at a higher atomic ratio than the second metal oxide film. Specifically, the first metal oxide film or the third metal oxide film may be an oxide film containing the above element at an atomic ratio 1.5 times or more, preferably twice or more, and more preferably three times or more that in the second metal oxide film. The above element is strongly bonded to oxygen, and thus has a function of suppressing generation of oxygen vacancies in the oxide film. That is, oxygen vacancies are less likely to be generated in the first metal oxide film or the third metal oxide film than in the second metal oxide film.

The first metal oxide film and the third metal oxide film each have a thickness of 3 nm to 100 nm, preferably 3 nm to 50 nm. The second metal oxide film has a thickness of 3 nm to 200 nm, preferably 3 nm to 100 nm, and more preferably 3 nm to 50 nm.

In the three-layer semiconductor film, the first metal oxide film and the third metal oxide film can be amorphous or crystalline. Note that the second metal oxide film in which a channel region is formed preferably has a crystalline structure, in which case the transistor can have stable electrical characteristics.

Embodiment 7

Figure 28:
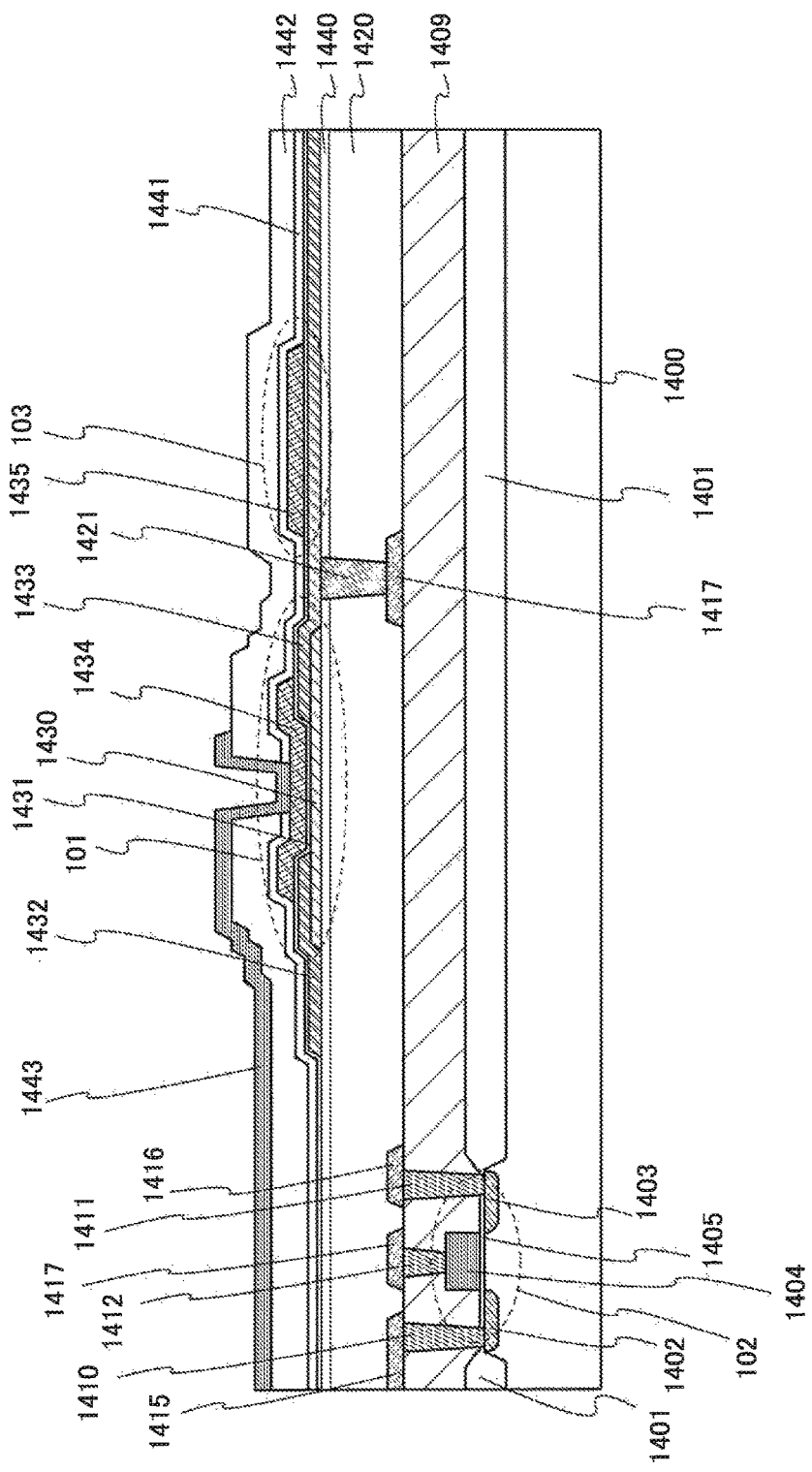
FIG. 28 is a cross-sectional view of a semiconductor device.

An example of the semiconductor devices shown in Embodiments 1 to 5 will be described. FIG. 28 illustrates an example of a cross-sectional structure of the transistor 101, the transistor 102, and the capacitor 103 included in the semiconductor device 100 illustrated in FIG. 1.

The channel of the transistor 101 is formed in an oxide semiconductor layer. The case where the transistor 101 and the capacitor 103 are formed over the transistor 102 which has a channel formation region in a single crystal silicon substrate is shown.

Note that an active layer in the transistor 102 can be an amorphous, microcrystalline, polycrystalline, or single crystal semiconductor film of silicon, germanium, or the like. Alternatively, the transistor 102 may include an active layer containing an oxide semiconductor. In the case where all of the transistors include an active layer containing an oxide semiconductor, the transistor 101 is not necessarily stacked over the transistor 102, and the transistors 101 and 102 may be formed in the same layer.

When the transistor 102 is formed using a thin silicon film, any of the following can be used, for example: amorphous silicon formed by sputtering or vapor phase growth such as plasma-enhanced CVD, polycrystalline silicon obtained by crystallization of amorphous silicon by laser irradiation, and single crystal silicon obtained by separation of a surface portion of a single crystal silicon wafer by implantation of hydrogen ions or the like into the silicon wafer.

Examples of a semiconductor substrate 1400 in which the transistor 102 is formed are an n-type or p-type silicon substrate, germanium substrate, silicon germanium substrate, and compound semiconductor substrate (e.g., GaAs substrate, InP substrate, GaN substrate, SiC substrate, GaP substrate, GaInAsP substrate, and ZnSe substrate). As an example, FIG. 28 shows the case where an n-type single crystal silicon substrate is used.

The transistor 102 is electrically isolated from other transistors by an element isolation insulating film 1401. The element isolation insulating film 1401 can be formed by local oxidation of silicon (LOCOS), trench isolation, or the like.

Specifically, the transistor 102 includes impurity regions 1402 and 1403 that are formed in the semiconductor substrate 1400 and function as source and drain regions, a gate electrode 1404, and a gate insulating film 1405 between the semiconductor substrate 1400 and the gate electrode 1404. The gate electrode 1404 overlaps with a channel formation region formed between the impurity regions 1402 and 1403, with the gate insulating film 1405 placed therebetween.

An insulating film 1409 is provided over the transistor 102. Openings are formed in the insulating film 1409. A wiring 1410 in contact with the impurity region 1402, a wiring 1411 in contact with the impurity region 1403, and a wiring 1412 electrically connected to the gate electrode 1404 are formed in the openings.

The wiring 1410 is electrically connected to a wiring 1415 over the insulating film 1409. The wiring 1411 is electrically connected to a wiring 1416 over the insulating film 1409. The wiring 1412 is electrically connected to a wiring 1417 over the insulating film 1409.

An insulating film 1420 and an insulating film 1440 are formed to be stacked in this order over the wirings 1415 to 1417. An opening is formed in the insulating films 1420 and 1440. A wiring 1421 electrically connected to the wiring 1417 is formed in the opening.

In FIG. 28, the transistor 101 and the capacitor 103 are formed over the insulating film 1440.

The transistor 101 includes, over the insulating film 1440, a semiconductor film 1430 containing an oxide semiconductor; conductive films 1432 and 1433 that function as source and drain electrodes and are provided over the semiconductor film 1430; a gate insulating film 1431 over the semiconductor film 1430 and the conductive films 1432 and 1433; and a gate electrode 1434 that is provided over the gate insulating film 1431 and overlaps with the semiconductor film 1430 in the region between the conductive films 1432 and 1433. Note that the conductive film 1433 is electrically connected to the wiring 1421.

A conductive film 1435 is provided over the gate insulating film 1431 to overlap with the conductive film 1433. A portion in which the conductive films 1433 and 1435 overlap with each other with the gate insulating film 1431 placed therebetween functions as the capacitor 103.

Although FIG. 28 illustrates an example in which the capacitor 103 is provided over the insulating film 1440 together with the transistor 101, the capacitor 103 may be provided below the insulating film 1440 together with the transistor 102.

An insulating film 1441 and an insulating film 1442 are formed to be stacked in this order over the transistor 101 and the capacitor 103. An opening is formed in the insulating films 1441 and 1442. A conductive film 1443 that is in contact with the gate electrode 1434 in the opening is provided over the insulating film 1441.

In FIG. 28, the transistor 101 includes the gate electrode 1434 on at least one side of the semiconductor film 1430. Alternatively, the transistor 101 may include a pair of gate electrodes with the semiconductor film 1430 placed therebetween.

In the case where the transistor 101 has a pair of gate electrodes with the semiconductor film 1430 therebetween, one of the gate electrodes may be supplied with a signal for controlling the on/off state of the transistor 101, and the other of the gate electrodes may be supplied with a potential from another element. In this case, potentials with the same level may be supplied to the pair of gate electrodes, or a fixed potential such as the ground potential may be supplied only to the other of the gate electrodes. By controlling the level of the potential supplied to the other gate electrode, the threshold voltage of the transistor can be controlled.

In FIG. 28, the transistor 101 has a single-gate structure in which one channel formation region corresponding to one gate electrode 1434 is provided. Alternatively, the transistor 101 may have a multi-gate structure in which a plurality of gate electrodes electrically connected to each other are provided and thus a plurality of channel formation regions are included in one active layer.

Figure 29A:
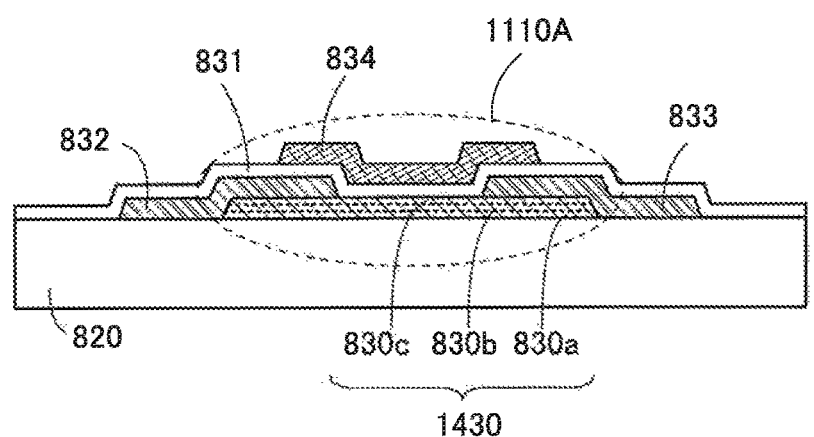
FIGS. 29A and 29B are cross-sectional views of transistors.

The semiconductor film 1430 is not limited to a single film of an oxide semiconductor and may be a stack including a plurality of oxide semiconductor films. FIG. 29A illustrates a structural example of a transistor 1110A in which the semiconductor film 1430 has a three-layer structure.

The transistor 1110A illustrated in FIG. 29A includes the semiconductor film 1430 over an insulating film 820 or the like, conductive films 832 and 833 electrically connected to the semiconductor film 1430, a gate insulating film 831, and a gate electrode 834 provided over the gate insulating film 831 so as to overlap with the semiconductor film 1430.

In the transistor 1110A, as the semiconductor film 1430, oxide semiconductor layers 830a to 830c are stacked in this order from the insulating film 820 side.

The oxide semiconductor layers 830a and 830c are each an oxide film that contains at least one of metal elements contained in the oxide semiconductor layer 830b. The energy at the bottom of the conduction band of the oxide semiconductor layers 830a and 830c is closer to a vacuum level than that of the oxide semiconductor layer 830b by 0.05 eV or more, 0.07 eV or more, 0.1 eV or more, or 0.15 eV or more and 2 eV or less, 1 eV or less, 0.5 eV or less, or 0.4 eV or less. The oxide semiconductor layer 830b preferably contains at least indium to increase carrier mobility.

Figure 29B:
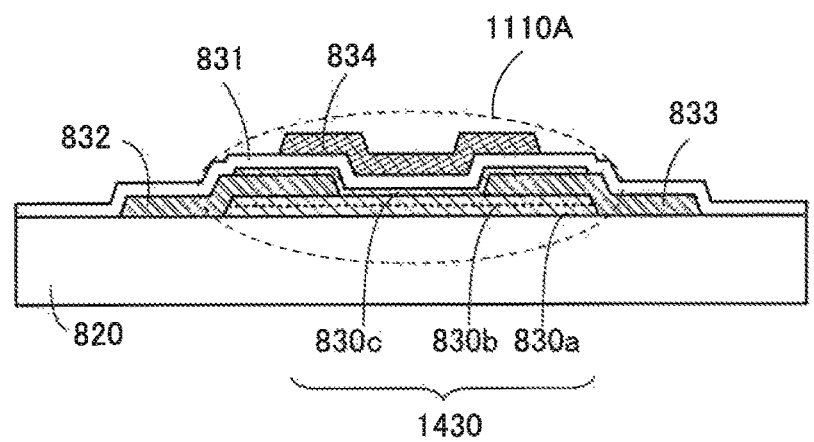

As illustrated in FIG. 29B, part of the oxide semiconductor layer 830c may be placed over the conductive films 832 and 833 to overlap with the gate insulating film 831.

Embodiment 8

The semiconductor device of one embodiment of the present invention can be used for display devices, personal computers, image reproducing devices provided with recording media (typically, devices which reproduce the content of recording media such as digital versatile discs (DVDs) and have displays for displaying the reproduced images), or the like. Other examples of electronic devices that can be equipped with the semiconductor device of one embodiment of the present invention are mobile phones, game machines including portable game consoles, portable data appliances, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 30A to 30D illustrate specific examples of these electronic devices.

Figure 30A:
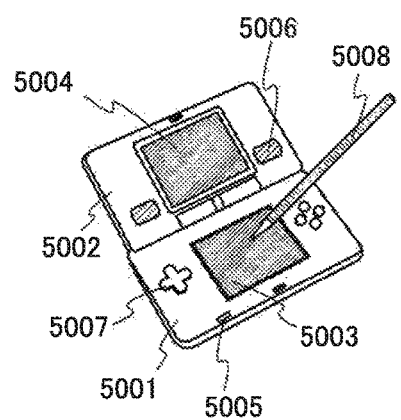
FIGS. 30A to 30F illustrate electronic devices.

FIG. 30A illustrates a portable game console including a housing 5001, a housing 5002, a display portion 5003, a display portion 5004, a microphone 5005, a speaker 5006, an operation key 5007, a stylus 5008, and the like. Although the portable game machine in FIG. 30A has the two display portions 5003 and 5004, the number of display portions included in a portable game machine is not limited to this.

Figure 30B:
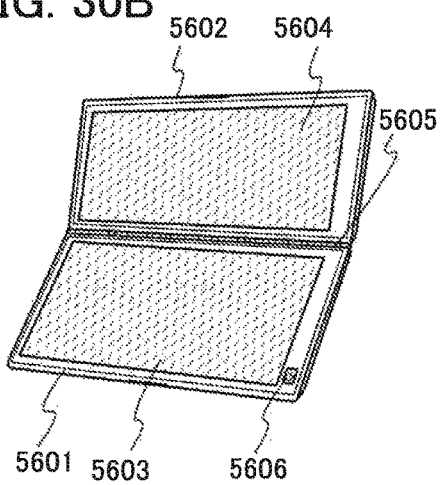

FIG. 30B illustrates a portable data terminal including a first housing 5601, a second housing 5602, a first display portion 5603, a second display portion 5604, a joint 5605, an operation key 5606, and the like. The first display portion 5603 is provided in the first housing 5601, and the second display portion 5604 is provided in the second housing 5602. The first housing 5601 and the second housing 5602 are connected to each other with the joint 5605, and the angle between the first housing 5601 and the second housing 5602 can be changed with the joint 5605. An image on the first display portion 5603 may be switched depending on the angle between the first housing 5601 and the second housing 5602 at the joint 5605. A display device with a position input function may be used as at least one of the first display portion 5603 and the second display portion 5604. Note that the position input function can be added by providing a touch panel in a display device. Alternatively, the position input function can be added by provision of a photoelectric conversion element called a photosensor in a pixel area of a display device.

Figure 30C:
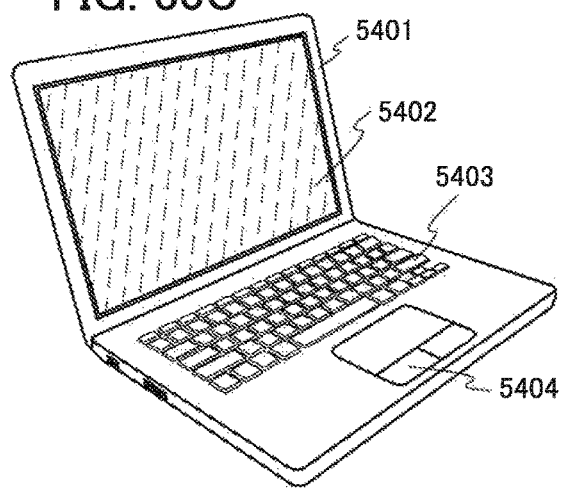

FIG. 30C illustrates a laptop personal computer, which includes a housing 5401, a display portion 5402, a keyboard 5403, a pointing device 5404, and the like.

Figure 30D:
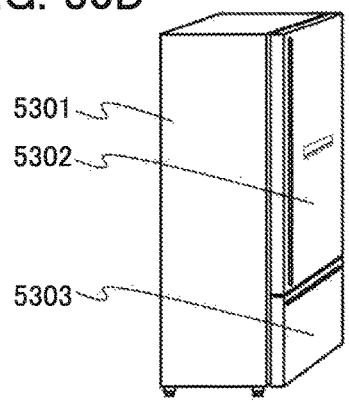

FIG. 30D illustrates the electric refrigerator-freezer including a housing 5301, a door for a refrigerator 5302, a door for a freezer 5303, and the like.

Figure 30E:
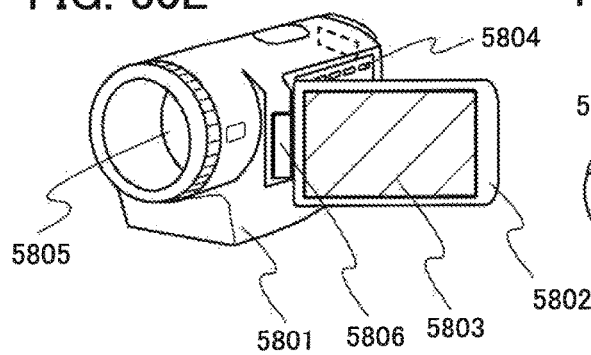

FIG. 30E illustrates a video camera, which includes a first housing 5801, a second housing 5802, a display portion 5803, operation keys 5804, a lens 5805, a joint 5806, and the like. The operation keys 5804 and the lens 5805 are provided for the first housing 5801, and the display portion 5803 is provided for the second housing 5802. The first housing 5801 and the second housing 5802 are connected to each other with the joint 5806, and the angle between the first housing 5801 and the second housing 5802 can be changed with the joint 5806. Images displayed on the display portion 5803 may be switched in accordance with the angle at the joint 5806 between the first housing 5801 and the second housing 5802.

Figure 30F:
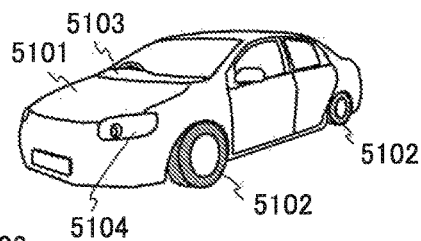

FIG. 30F illustrates a passenger car including a car body 5101, wheels 5102, a dashboard 5103, lights 5104, and the like.

REFERENCE NUMERALS

100: semiconductor device, memory cell; 101: transistor; 102: transistor; 103: capacitor; 104: node; 106: transistor; 107: transistor; 108: transistor; 111: wiring; 112: wiring; 113: wiring; 114: wiring; 115: wiring; 130: semiconductor device; 135: semiconductor device; 140: semiconductor device; 150: semiconductor device; 155: semiconductor device; 200: semiconductor device; 201: memory cell array; 202: row selection driver; 203: column selection driver; 204: A/D converter; 301: decoder; 302: control circuit; 401: decoder; 402: latch circuit; 403: D/A converter; 404: switch circuit; 405: transistor; 406: transistor; 501: comparator; 502: encoder; 503: latch circuit; 504: buffer; 600: semiconductor device; 820: insulating film; 832: conductive film; 833: conductive film; 831: gate insulating film; 834: gate electrode; 830*a*: oxide semiconductor layer; 830*b*: oxide semiconductor layer; 830*c*: oxide semiconductor layer; 1110A: transistor; 1400: semiconductor substrate; 1401: element isolation insulating film; 1402: impurity region; 1403: impurity region; 1404: gate electrode; 1405: gate insulating film; 1409: insulating film; 1410: wiring; 1411: wiring; 1412: wiring; 1415: wiring; 1416: wiring; 1417: wiring; 1420: insulating film; 1421: wiring; 1430: semiconductor film; 1431: gate insulating film; 1432: conductive film; 1433: conductive film; 1434: gate electrode; 1435: conductive film; 1440: insulating film; 1441: insulating film; 1442: insulating film; 1443: conductive film; 5001: housing; 5002: housing; 5003: display portion; 5004: display portion; 5005: microphone; 5006: speaker; 5007: operation key; 5008: stylus; 5101: car body; 5102: wheel; 5103: dashboard; 5104: light; 5301: housing; 5302: door for refrigerator; 5303: door for freezer; 5401: housing; 5402: display portion; 5403: keyboard; 5404: pointing device; 5601: housing; 5602: housing; 5603: display portion; 5604: display portion; 5605: joint; 5606: operation key; 5801: housing; 5802: housing; 5803: display portion; 5804: operation key; 5805: lens; 5806: joint This application is based on Japanese Patent Application serial no. 2013-060687 filed with Japan Patent Office on Mar. 22, 2013, the entire contents of which are hereby incorporated by reference.

The invention claimed is:

1. A method for driving a semiconductor device including a first transistor whose channel region includes an oxide semiconductor, a second transistor, and a capacitor whose one electrode electrically connected to one of a source and a drain of the first transistor and a gate of the second transistor, the method comprising:
   applying a fourth low voltage to a bit line and a first wiring, applying a first high voltage to a word line to turn on the first transistor, and applying a second low voltage to a capacitor line, thereby turning on the second transistor, wherein:
      the word line is electrically connected to a gate of the first transistor,
      the first wiring is electrically connected to one of a source and a drain of the second transistor,
      the bit line is electrically connected to the other of the source and the drain of the first transistor and the other of the source and the drain of the second transistor, and
      the capacitor line is electrically connected to the other electrode of the capacitor;
   applying a first voltage to the first wiring and stopping the application of the fourth low voltage to the bit line so that a voltage corresponding to the first voltage is applied to the gate of the second transistor from the first wiring through the source and the drain of the second transistor, the bit line, and the source and the drain of the first transistor;
   applying a first low voltage to the word line to turn off the first transistor, applying the fourth low voltage to the bit line and the first wiring, and applying a second high voltage to the capacitor line to turn off the second transistor;
   applying a third high voltage to the first wiring; and
   stopping the application of the third high voltage to the first wiring, and applying the second low voltage to the capacitor line so that a voltage of the first wiring changes from the third high voltage to the first voltage.

2. The method according to claim 1,
   wherein a channel region of the second transistor includes silicon.

3. The method according to claim 1,
   further comprising converting a potential of the first wiring into digital value and outputting the digital value outside, wherein an A/D converter electrically connected to the first wiring converts the potential of the first wiring.

4. A method for driving a semiconductor device including a first transistor whose channel region includes an oxide semiconductor, a second transistor, a third transistor, and a capacitor whose one electrode electrically connected to one of a source and a drain of the first transistor and a gate of the second transistor, the method comprising:
applying a fourth low voltage to a bit line and a first wiring, applying a first high voltage to a first word line to turn on the first transistor, applying the fourth low voltage of the bit line to the gate of the second transistor to turn on the second transistor, and applying a second low voltage to a second word line to turn on the third transistor, wherein:
the first word line is electrically connected to a gate of the first transistor,
the second word line is electrically connected to a gate of the third transistor,
the first wiring is electrically connected to one of a source and a drain of the second transistor
one of a source and a drain of the third transistor is electrically connected to the other of the source and the drain of the second transistor,
the bit line is electrically connected to the other of the source and the drain of the first transistor and the other of the source and the drain of the third transistor, and
a fifth low voltage is applied to the other electrode of the capacitor;
applying a first voltage to the first wiring, and stopping the application of the fourth low voltage to the bit line so that a voltage corresponding to the first voltage is applied to the gate of the second transistor from the first wiring through the source and the drain of the second transistor, the source and the drain of the third transistor, the bit line, and the source and the drain of the first transistor;
applying a first low voltage to the first word line to turn off the first transistor, applying the fourth low voltage to the bit line and the first wiring, and applying a second high voltage to the second word line to turn off the third transistor;
applying a third high voltage to the first wiring; and
stopping the application of the third high voltage to the first wiring, and applying the second low voltage to the second word line to turn on the third transistor so that a voltage of the first wiring changes from the third high voltage to the first voltage.

5. The method according to claim 4,
wherein a channel region of the second transistor includes silicon.

6. The method according to claim 4,
wherein a channel region of the second transistor includes silicon, and
wherein a channel region of the third transistor includes silicon.

7. The method according to claim 4, further comprising converting a potential of the first wiring into a digital value and outputting the digital value outside,
wherein an A/D converter electrically connected to the first wiring converts the potential of the first wiring.

8. A method for driving a semiconductor device including a first transistor whose channel region includes an oxide semiconductor, a second transistor, and a capacitor whose one electrode electrically connected to one of a source and a drain of the first transistor and a gate of the second transistor, the method comprising:
applying a fourth high voltage to a bit line, applying a third high voltage to a first wiring, applying a first high voltage to a word line to turn on the first transistor, and applying a second high voltage to a capacitor line, thereby turning on the second transistor, wherein:
the word line is electrically connected to a gate of the first transistor,
the first wiring is electrically connected to one of a source and a drain of the second transistor,
the bit line is electrically connected to the other of the source and the drain of the first transistor and the other of the source and the drain of the second transistor, and
the capacitor line is electrically connected to the other electrode of the capacitor;
applying a first voltage to the first wiring and stopping application of the fourth high voltage to the bit line so that a voltage corresponding to the first voltage is applied to the gate of the second transistor from the first wiring through the source and the drain of the second transistor, the bit line, and the source and the drain of the first transistor;
applying a first low voltage to the word line to turn off the first transistor, applying the fourth high voltage to the bit line and the first wiring, and applying a second low voltage to the capacitor line to turn off the second transistor;
applying a third low voltage to the first wiring; and
stopping the application of the third low voltage to the first wiring, and applying the second high voltage to the capacitor line so that a voltage of the first wiring changes from the third low voltage to the first voltage.

9. The method according to claim 8,
wherein a channel region of the second transistor includes silicon.

10. The method according to claim 8, further comprising converting a potential of the first wiring into a digital value and outputting the digital value outside,
wherein an A/D converter electrically connected to the first wiring converts the potential of the first wiring.

11. A method for driving a semiconductor device including a first transistor whose channel region includes an oxide semiconductor, a second transistor, a third transistor, and a capacitor whose one electrode electrically connected to one of a source and a drain of the first transistor and a gate of the second transistor, the method comprising:
applying a fourth high voltage to a bit line and a first wiring, applying a first high voltage to a first word line to turn on the first transistor, applying the fourth high voltage of the bit line to the gate of the second transistor to turn on the second transistor, and applying a second high voltage to a second word line to turn on the third transistor, wherein:
the first word line is electrically connected to a gate of the first transistor,
the second word line is electrically connected to a gate of the third transistor,
the first wiring is electrically connected to one of a source and a drain of the second transistor
one of a source and a drain of the third transistor is electrically connected to the other of the source and the drain of the second transistor, the bit line is electrically connected to the other of the source and the drain of the first transistor and the other of the source and the drain of the third transistor, and a fifth low voltage is applied to the other electrode of the capacitor;

applying a first voltage to the first wiring, and stopping the application of the fourth high voltage to the bit line so that a voltage corresponding to the first voltage is applied to the gate of the second transistor from the first wiring through the source and the drain of the second transistor, the source and the drain of the third transistor, the bit line, and the source and the drain of the first transistor;

applying a first low voltage to the first word line to turn off the first transistor, applying the fourth high voltage to the bit line, applying a third high voltage to the first wiring, and applying a second low voltage to the second word line to turn off the third transistor;

applying a third low voltage to the first wiring; and stopping the application of the third low voltage to the first wiring, and applying the second high voltage to the second word line to turn on the third transistor so that a voltage of the first wiring changes from the third low voltage to the first voltage.

12. The method according to claim 11,
wherein a channel region of the second transistor includes silicon.

13. The method according to claim 11,
wherein a channel region of the second transistor includes silicon, and
wherein a channel region of the third transistor includes silicon.

14. The method according to claim 11, further comprising converting a potential of the first wiring into a digital value and outputting the digital value outside,
wherein an A/D converter electrically connected to the first wiring converts the potential of the first wiring.

* * * * *